(12) United States Patent
Nishimoto et al.

(10) Patent No.: US 8,789,944 B2
(45) Date of Patent: Jul. 29, 2014

(54) OPTICAL ARTICLE AND OPTICAL ARTICLE PRODUCTION METHOD

(75) Inventors: Keiji Nishimoto, Ina (JP); Takashi Noguchi, Shiojiri (JP); Hiroyuki Seki, Matsumoto (JP)

(73) Assignee: Hoya Lens Manufacturing Philippines Inc., Cavite (PH)

( * ) Notice: Subject to any disclaimer, the term of this patent is extended or adjusted under 35 U.S.C. 154(b) by 79 days.

(21) Appl. No.: 13/172,587

(22) Filed: Jun. 29, 2011

(65) Prior Publication Data

US 2012/0026456 A1 Feb. 2, 2012

(30) Foreign Application Priority Data

Aug. 2, 2010 (JP) ................................. 2010-173381

(51) Int. Cl.
*G02C 7/02* (2006.01)

(52) U.S. Cl.
USPC .................................................... 351/159.01

(58) Field of Classification Search
USPC .......... 359/585, 707, 580, 581, 586; 351/159, 351/159.01, 159.62, 159.57, 159.77, 159.8
See application file for complete search history.

(56) References Cited

U.S. PATENT DOCUMENTS

| | | | |
|---|---|---|---|
| 3,922,068 A | 11/1975 | Uetsuki | |
| 4,609,267 A | 9/1986 | Deguchi et al. | |
| 4,772,511 A | 9/1988 | Wood et al. | |
| 4,839,949 A | 6/1989 | Sobue et al. | |
| 4,999,096 A | 3/1991 | Nihei et al. | |
| 5,372,874 A | 12/1994 | Dickey et al. | |
| 5,563,448 A | 10/1996 | Lee et al. | |
| 5,597,622 A | 1/1997 | Zoller et al. | |
| 5,619,288 A | 4/1997 | White, Jr. et al. | |
| 5,719,705 A | 2/1998 | Machol | |
| 5,725,959 A | 3/1998 | Terada | |
| 5,888,593 A | 3/1999 | Zinbarg et al. | |
| 6,296,793 B1 | 10/2001 | Anthes et al. | |
| 6,399,228 B1 | 6/2002 | Simpson | |
| 6,416,872 B1 | 7/2002 | Maschwitz | |
| 6,468,402 B1 | 10/2002 | Vanderstraeten | |
| 6,579,423 B2 | 6/2003 | Anzaki et al. | |
| 6,627,320 B2 | 9/2003 | Mitsuishi et al. | |
| 6,645,608 B2 | 11/2003 | Schulz | |

(Continued)

FOREIGN PATENT DOCUMENTS

DE 1696111 A 1/1972
DE 102006056578 A1 6/2008

(Continued)

OTHER PUBLICATIONS

Feng et al., "Carbonate apatite coating on titanium induced rapidly by precalcification" Biomaterials, vol. 23, pp. 173-179, 2002.

(Continued)

*Primary Examiner* — James Greece
*Assistant Examiner* — Jie Lei
(74) *Attorney, Agent, or Firm* — DLA Piper LLP (US)

(57) ABSTRACT

An optical article comprising: an optical base material; and a translucent layer that contains $TiO_x$ ($0<x\leq2$), the translucent layer is formed on the optical base material either directly or via some other layer, and the translucent layer has an argon concentration higher on a surface side of the translucent layer than on an optical base material side of the translucent layer.

14 Claims, 13 Drawing Sheets

(56) References Cited

U.S. PATENT DOCUMENTS

| | | | |
|---|---|---|---|
| 6,686,262 B2* | 2/2004 | Yamazaki et al. ............ 438/486 |
| 6,768,581 B1 | 7/2004 | Yip et al. |
| 6,924,037 B1 | 8/2005 | Joret et al. |
| 6,947,209 B2 | 9/2005 | Kanazawa et al. |
| 7,133,218 B2 | 11/2006 | Hori et al. |
| 7,261,957 B2 | 8/2007 | Bijkerk et al. |
| 7,332,213 B2 | 2/2008 | Mimura et al. |
| 7,379,244 B2 | 5/2008 | Watanabe et al. |
| 7,483,226 B2 | 1/2009 | Kunii |
| 7,538,055 B2 | 5/2009 | Tsukuma et al. |
| 7,618,753 B2 | 11/2009 | Yoshikawa et al. |
| 7,621,682 B2 | 11/2009 | Miyazaki et al. |
| 7,833,629 B2 | 11/2010 | Anderson et al. |
| 7,948,675 B2 | 5/2011 | Shiraishi |
| 8,128,255 B2 | 3/2012 | Yeh |
| 8,215,766 B2 | 7/2012 | Nishimoto et al. |
| 2002/0017452 A1 | 2/2002 | Zimmerman et al. |
| 2002/0155361 A1 | 10/2002 | Takeuchi et al. |
| 2003/0064179 A1 | 4/2003 | Kijima et al. |
| 2003/0175557 A1 | 9/2003 | Anderson et al. |
| 2003/0179343 A1 | 9/2003 | Marechal et al. |
| 2003/0218798 A1 | 11/2003 | Kanazawa et al. |
| 2004/0142185 A1 | 7/2004 | Takushima |
| 2004/0196688 A1 | 10/2004 | Yamamoto et al. |
| 2005/0074591 A1 | 4/2005 | Zagdoun |
| 2005/0168685 A1 | 8/2005 | Katagiri et al. |
| 2005/0219696 A1 | 10/2005 | Albert et al. |
| 2006/0251884 A1 | 11/2006 | Naito et al. |
| 2007/0065638 A1 | 3/2007 | Wang et al. |
| 2007/0159697 A1 | 7/2007 | Terayama |
| 2007/0229945 A1* | 10/2007 | Shibuya ....................... 359/359 |
| 2007/0279750 A1 | 12/2007 | Yaoita et al. |
| 2007/0287025 A1 | 12/2007 | Furubayashi et al. |
| 2008/0102379 A1 | 5/2008 | Wu et al. |
| 2008/0115471 A1 | 5/2008 | Labrousse et al. |
| 2008/0174876 A1 | 7/2008 | Fukui et al. |
| 2008/0224089 A1 | 9/2008 | Pei |
| 2009/0066911 A1 | 3/2009 | Ishizaki et al. |
| 2009/0104385 A1 | 4/2009 | Reymond et al. |
| 2009/0141357 A1* | 6/2009 | Kamura et al. ............... 359/585 |
| 2009/0191391 A1 | 7/2009 | Naito et al. |
| 2009/0261063 A1 | 10/2009 | Munzert et al. |
| 2009/0297773 A1 | 12/2009 | Wang |
| 2010/0027383 A1 | 2/2010 | Suzuki et al. |
| 2010/0078630 A1 | 4/2010 | Kaneta et al. |
| 2010/0103523 A1 | 4/2010 | Fukui et al. |
| 2010/0104838 A1 | 4/2010 | Noguchi et al. |
| 2010/0149642 A1 | 6/2010 | Chen et al. |
| 2010/0177395 A1 | 7/2010 | Nishimoto et al. |
| 2010/0225882 A1 | 9/2010 | Nishimoto et al. |
| 2010/0226004 A1 | 9/2010 | Nishimoto et al. |
| 2010/0226005 A1 | 9/2010 | Nishimoto et al. |
| 2010/0328605 A1 | 12/2010 | Suzuki |
| 2011/0017272 A1 | 1/2011 | Anderson |
| 2011/0033635 A1 | 2/2011 | Nishimoto et al. |
| 2011/0117345 A1 | 5/2011 | Nishimoto et al. |
| 2012/0019913 A1 | 1/2012 | Nishimoto et al. |
| 2012/0075705 A1* | 3/2012 | Beinat et al. .................. 359/585 |
| 2012/0154916 A1 | 6/2012 | Nishimoto et al. |

FOREIGN PATENT DOCUMENTS

| | | | |
|---|---|---|---|
| DE | 102008029158 A1 | 6/2009 |
| EP | 0224375 A2 | 6/1987 |
| EP | 0529268 A2 | 3/1993 |
| EP | 0292387 B1 | 7/1994 |
| EP | 1043606 A1 | 10/2000 |
| EP | 1148037 A1 | 10/2001 |
| EP | 1227346 A2 | 7/2002 |
| EP | 1693482 A1 | 8/2006 |
| EP | 1811335 A1 | 7/2007 |
| EP | 1845392 A1 | 10/2007 |
| EP | 2209023 A1 | 7/2010 |
| FR | 2898295 A1 | 9/2007 |
| JP | H01157579 A | 6/1989 |
| JP | H02103002 A | 4/1990 |
| JP | 03129301 A | 6/1991 |
| JP | 04166901 A | 6/1992 |
| JP | H04332938 A | 11/1992 |
| JP | H05183207 A | 7/1993 |
| JP | H05206531 A | 8/1993 |
| JP | 05330856 A | 12/1993 |
| JP | 06340966 A | 12/1994 |
| JP | 10120445 A | 5/1998 |
| JP | H10160902 A | 6/1998 |
| JP | 2000503070 A | 3/2000 |
| JP | 2000157841 A | 6/2000 |
| JP | 2001-233611 | 8/2001 |
| JP | 2002258006 A | 9/2002 |
| JP | 2002358898 A | 12/2002 |
| JP | 2003131010 A | 5/2003 |
| JP | 2003239067 A | 8/2003 |
| JP | 2003294906 A | 10/2003 |
| JP | 2003322709 A | 11/2003 |
| JP | 2003536097 A | 12/2003 |
| JP | 2004029348 A | 1/2004 |
| JP | 2004085231 A | 3/2004 |
| JP | 2004170962 A | 6/2004 |
| JP | 2004271480 A | 9/2004 |
| JP | 2004300580 A | 10/2004 |
| JP | 2004-341052 | 12/2004 |
| JP | 2005187936 A | 7/2005 |
| JP | 2005274327 A | 10/2005 |
| JP | 2005301208 A | 10/2005 |
| JP | 2006010764 A | 1/2006 |
| JP | 2006091694 A | 4/2006 |
| JP | 2006113287 A | 4/2006 |
| JP | 2006126782 A | 5/2006 |
| JP | 2006146025 A | 6/2006 |
| JP | 2006184849 A | 7/2006 |
| JP | 2006221142 A | 8/2006 |
| JP | 2006275526 A | 10/2006 |
| JP | 2006337672 A | 12/2006 |
| JP | 2007173551 A | 7/2007 |
| JP | 2007233333 A | 9/2007 |
| JP | 2007279203 A | 10/2007 |
| JP | 2008180795 A | 8/2008 |
| JP | 2009042278 A | 2/2009 |
| JP | 2009067845 A | 4/2009 |
| JP | 2009128820 A | 6/2009 |
| JP | 2009217018 A | 9/2009 |
| JP | 2010103500 A | 5/2010 |
| JP | 2010140008 A | 6/2010 |
| JP | 2010186159 A | 8/2010 |
| JP | 2010186160 A | 8/2010 |
| JP | 2010210945 A | 9/2010 |
| JP | 2010231172 A | 10/2010 |
| JP | 2010231173 A | 10/2010 |
| JP | 2010231174 A | 10/2010 |
| JP | 2010237637 A | 10/2010 |
| JP | 2010237639 A | 10/2010 |
| WO | 0137006 A1 | 5/2001 |
| WO | 0155752 A1 | 8/2001 |
| WO | 0204374 A2 | 1/2002 |
| WO | 0218132 A2 | 3/2002 |
| WO | 03074440 A2 | 9/2003 |
| WO | 2006016608 A1 | 2/2006 |
| WO | 2008001011 A2 | 1/2008 |
| WO | 2009083145 A2 | 7/2009 |

OTHER PUBLICATIONS

U.S. office action dated Feb. 28, 2013 issued in related U.S. Appl. No. 13/187,386.

U.S. office action dated Oct. 22, 2012 issued in related U.S. Appl. No. 12/695,795.

U.S. office action dated Mar. 3, 2011 issued in related U.S. Appl. No. 12/643,762.

U.S. office action dated Aug. 23, 2011 issued in related U.S. Appl. No. 12/643,762.

U.S. final office action dated Jan. 25, 2012 issued in related U.S. Appl. No. 12/643,762.

(56) References Cited

OTHER PUBLICATIONS

Extended European search report dated Mar. 30, 2010 issued in related European application 10150514.7.
U.S. office action dated Nov. 10, 2011 issued in related U.S. Appl. No. 12/496,110.
U.S. office action dated Jul. 9, 2012 issued in related U.S. Appl. No. 12/496,110.
U.S. office action dated Feb. 16, 2012 issued in related U.S. Appl. No. 12/510,836.
Extended European search report dated Jan. 28, 2010 issued in related European application 09013345.5.
U.S. office action dated May 18, 2011 issued in related U.S. Appl. No. 12/560,266.
Extended European search report dated Jan. 15, 2010 issued in related European application 09013318.2.
U.S. office action dated Oct. 2, 2012 issued in related U.S. Appl. No. 12/844,701.
Extended European search report dated Oct. 15, 2010 issued in related European application 10172158.7.
Geoffrey Dearnaley, "Altering Material Surfaces to Prolong Service Life" swri.org. Southwest Research Institute, Mar. 1994, URL: http://www.swri.org/3pubs/brochure/d06/ams/ams,htm.
U.S. final office action dated Jul. 10, 2012 issued in related U.S. Appl. No. 12/710,974.
U.S. office action dated Mar. 29, 2012 issued in related U.S. Appl. No. 12/710,974.
Dobrowolski, J.A. (eds. Bass et al.) "Optical Properties of Films & Coatings" Handbook of Optics: vol. I, Fundamentals, Techniques, and Design, pp. 42.3-42.130, 1995.
U.S. office action dated Jan. 23, 2013 issued in related U.S. Appl. No. 12/914,464.
Extended European search report dated Jan. 31, 2012 issued in related European application 11193225.7.
Chin Saika, "Development of new production method for high-performance, visible light-type titanium dioxide photocatalyst" (with English translation) Kanac Corporation and Research Institute for Solvothermal Technology, pp. 1-4, Jun. 22, 2007 URL: http://www.kagawa-isf.jp/rist/seika/-happyou/18tang.html.
Partial European search report dated Jun. 28, 2013 issued in corresponding European application 11175764.4.
Extended European search report dated Nov. 12, 2013 issued in corresponding European application 11175746.4.
Yasushi Sato et al., "Transparent conductive Nb-doped $TiO_2$ films deposited by direct-current magnetron sputtering using a $TiO_{2-x}$ target" Thin Solid Films, vol. 516, pp. 5758-5762, 2008.
Ngoc Lam Huong Hoang et al., "Low-temperature Fabrication of Transparent Conducting Anatase Nb-doped $Tio_2$ Films by Sputtering" Applied Physics Express, vol. 1, pp. 115001-1 to 115001-3, 2008.
Chinese language office action dated Dec. 27, 2013 and its English language translation issued in related Chinese application 201010250256.
European office action dated Jan. 2, 2013 issued in related European application 10172158.7.
European office action dated Dec. 20, 2013 issued in related European application 10172158.7.
Japanese language office action dated Feb. 12, 2014 and its English language translation issued in corresponding Japanese application 2009199465.
Japanese language office action dated Feb. 25, 2014 and its English language translation issued in related Japanese application 2010173381.
U.S. final office action dated May 21, 2014 issued in related U.S. Appl. No. 12/844,701.

\* cited by examiner

| | LAYER CONFIGURATION TYPE OF ANTIREFLECTION COATING | ANTIREFLECTION COATING (THICKNESS, nm) | | | | | | |
|---|---|---|---|---|---|---|---|---|
| | | FIRST LAYER | SECOND LAYER | THIRD LAYER | FOURTH LAYER | CONDUCTION PROCESSING LAYER | ION BOMBARDMENT | FIFTH LAYER |
| | | $SiO_2$ | $ZrO_2$ | $SiO_2$ | $ZrO_2$ | $TiO_2$ | | $SiO_2$ |
| EXAMPLE 1~9 | A | 29 | 40 | 16 | 60 | 4~15 | PRESENT | 91 |
| COMPARATIVE EXAMPLE 1 | A | 29 | 40 | 16 | 60 | 8($TiO_y$) y=1.7 | ABSENT | 91 |
| COMPARATIVE EXAMPLE 2 | A | 29 | 40 | 16 | 60 | 8 | PRESENT (ONLY Ar) | 91 |

FIG. 3

| | ION IRRADIATION TIME (SEC) | TiO2 LAYER THICKNESS (nm) | Ar gas flow (SCCM) | O2 gas flow (SCCM) | ION ACCELERATION VOLTAGE (V) | ION BEAM CURRENT (mA) | optical ABSORPTION LOSS (%) | INITIAL SHEET RESISTANCE (Ω/□) | ANTISTATIC PROPERTY (INITIAL) | ANTISTATIC PROPERTY DURABILITY |
|---|---|---|---|---|---|---|---|---|---|---|
| EXAMPLE 1 (S1) | 30 | 8 | 16.5 | 3.5 | 800 | 200 | 0.7 | $1 \times 10^{10}$ | ○ | △ |
| EXAMPLE 2 (S2) | 120 | 8 | 16.5 | 3.5 | 800 | 200 | 0.75 | $4 \times 10^{8}$ | ○ | ◎ |
| EXAMPLE 3 (S3) | 240 | 8 | 16.5 | 3.5 | 800 | 200 | 0.77 | $3 \times 10^{8}$ | ○ | ◎ |
| COMPARATIVE EXAMPLE 1 (R1) | NO TREATMENT | 8 (TiO_y) | NO TREATMENT | NO TREATMENT | NO TREATMENT | NO TREATMENT | 0.2 | $1 \times 10^{12}$ | △ | × |
| COMPARATIVE EXAMPLE 2 (R2) | 120 | 8 | 20 | 0 | 800 | 200 | 2.26 | $6 \times 10^{5}$ | ○ | ◎ |

FIG. 4

| | EXAMPLE 1 (SAMPLE X1) | EXAMPLE 2 (SAMPLE X2) | EXAMPLE 3 (SAMPLE X3) |
|---|---|---|---|
| SUBSTRATE | GLASS (FOR ELECTRICAL RESISTANCE MEASUREMENT) | Si WAFER (FOR XPS) | |
| TiO₂ THICKNESS | 8nm | | |
| CONDITIONS OF TiO₂ FORMATION | FORMED BY ION-ASSISTED VAPOR DEPOSITION DEPOSITION RATE:0.4nm/sec, ION BEAM CURRENT:200mA, INTRODUCED GAS TO ION GUN:OXYGEN GAS 35sccm, AMOUNT OF GAS CHARGED INTO CHAMBER:15sccm | | |
| ION GUN CONDITIONS | INTRODUCED GAS TO ION GUN:Ar=16.5sccm, O₂=3.5sccm VOLTAGE OF IRRADIATION ION BEAM:800 v, ION BEAM CURRENT:200mA | | VOLTAGE OF IRRADIATION ION BEAM:500 v, ION BEAM CURRENT:200mA |
| ION BEAM IRRADIATION TIME | 30 SECONDS | 120 SECONDS | 240 SECONDS |
| Ar ATOM CONCENTRATION BY XPS OBSERVATION (MEASURED WITH A PHOTOELECTRON ESCAPE ANGLE OF 45°) | 2.1% | 2.5% | 2.5% |
| SHEET RESISTANCE (Ω/□) | $1.2 \times 10^{11}$ | $5 \times 10^{10}$ | $5 \times 10^{10}$ |
| DETERIORATION OF SHEET RESISTANCE | △ | ◎ | ◎ |

FIG. 7

| | ION IRRADIATION TIME (SEC) | TiO2 LAYER THICKNESS (nm) | Ar gas flow (SCCM) | O2 gas flow (SCCM) | ION ACCELERATION VOLTAGE (V) | ION BEAM CURRENT (mA) | optical ABSORPTION LOSS (%) | INITIAL SHEET RESISTANCE (Ω/□) | ANTISTATIC PROPERTY (INITIAL) | ANTISTATIC PROPERTY DURABILITY |
|---|---|---|---|---|---|---|---|---|---|---|
| EXAMPLE 4 | 120 | 4 | 16.5 | 3.5 | 800 | 200 | 0.23 | $5 \times 10^{10}$ | ○ | △ |
| EXAMPLE 5 | 120 | 6 | 16.5 | 3.5 | 800 | 200 | 0.49 | $1 \times 10^{9}$ | ○ | ○ |
| EXAMPLE 6 | 120 | 8 | 16.5 | 3.5 | 800 | 200 | 0.74 | $3 \times 10^{8}$ | ○ | ◎ |
| EXAMPLE 7 | 120 | 10 | 16.5 | 3.5 | 800 | 200 | 0.91 | $2 \times 10^{8}$ | ○ | ◎ |
| EXAMPLE 8 | 120 | 12 | 16.5 | 3.5 | 800 | 200 | 1.1 | $1 \times 10^{8}$ | ○ | ◎ |
| EXAMPLE 9 | 120 | 15 | 16.5 | 3.5 | 800 | 200 | 1.4 | $8 \times 10^{7}$ | ○ | ◎ |

| | LAYER CONFIGURATION TYPE OF ANTIREFLECTION COATING | ANTIREFLECTION COATING (THICKNESS, nm) | | | | | | | |
|---|---|---|---|---|---|---|---|---|---|
| | | FIRST LAYER | SECOND LAYER | | THIRD LAYER | FOURTH LAYER | FIFTH LAYER | SIXTH LAYER | SEVENTH LAYER |
| | | $SiO_2$ | $TiO_2$ | ION BOMBARDMENT | $SiO_2$ | $TiO_2$ | $SiO_2$ | $TiO_2$ | $SiO_2$ |
| EXAMPLE 10 | B | 16.8 | 13.3 | PRESENT | 28.0 | 46.0 | 12.4 | 37.5 | 90.5 |
| COMPARATIVE EXAMPLE 3 | B | 16.8 | 13.3 | ABSENT | 28.0 | 46.0 | 12.4 | 37.5 | 90.5 |

FIG. 15B

| | LAYER CONFIGURATION TYPE OF ANTIREFLECTION COATING | ANTIREFLECTION COATING (THICKNESS, nm) | | | | | | SIXTH LAYER | | SEVENTH LAYER |
|---|---|---|---|---|---|---|---|---|---|---|
| | | FIRST LAYER | SECOND LAYER | THIRD LAYER | FOURTH LAYER | FIFTH LAYER | | | ION BOMBARDMENT | |
| | | $SiO_2$ | $TiO_2$ | $SiO_2$ | $TiO_2$ | $SiO_2$ | $TiO_2$ | | | $SiO_2$ |
| EXAMPLE 11 | B | 16.8 | 13.3 | 28.0 | 46.0 | 12.4 | 37.5 | | PRESENT | 90.5 |
| COMPARATIVE EXAMPLE 4 | B | 16.8 | 13.3 | 28.0 | 46.0 | 12.4 | 37.5 | | ABSENT | 90.5 |

| | ION IRRADIATION TIME (SEC) | TiO₂ LAYER THICKNESS (nm) | Ar gas flow (SCCM) | O₂ gas flow (SCCM) | ION ACCELERATION VOLTAGE (V) | ION BEAM CURRENT (mA) | optical ABSORPTION LOSS(%) | INITIAL SHEET RESISTANCE (Ω/□) | ANTISTATIC PROPERTY (INITIAL) | ANTISTATIC PROPERTY DURABILITY |
|---|---|---|---|---|---|---|---|---|---|---|
| EXAMPLE 10 | 120 | 13.3 | 15 | 5 | 800 | 200 | 0.75 | $1 \times 10^9$ | ○ | ○ |
| COMPARATIVE EXAMPLE 3 | NO TREATMENT | 13.3 | NO TREATMENT | NO TREATMENT | NO TREATMENT | NO TREATMENT | 0.2 | $1 \times 10^{13}$ | × | NOT MEASURED |

FIG. 16A

| | ION IRRADIATION TIME (SEC) | TiO₂ LAYER THICKNESS (nm) | Ar gas flow (SCCM) | O₂ gas flow (SCCM) | ION ACCELERATION VOLTAGE (V) | ION BEAM CURRENT (mA) | optical ABSORPTION LOSS(%) | INITIAL SHEET RESISTANCE (Ω/□) | ANTISTATIC PROPERTY (INITIAL) | ANTISTATIC PROPERTY DURABILITY |
|---|---|---|---|---|---|---|---|---|---|---|
| EXAMPLE 11 | 120 | 37.5 | 10 | 10 | 800 | 200 | 0.90 | $2 \times 10^9$ | ○ | ○ |
| COMPARATIVE EXAMPLE 4 | NO TREATMENT | 37.5 | NO TREATMENT | NO TREATMENT | NO TREATMENT | NO TREATMENT | 0.2 | $1 \times 10^{13}$ | × | NOT MEASURED |

FIG. 16B

OPTICAL ARTICLE AND OPTICAL ARTICLE PRODUCTION METHOD

This application claims priority to Japanese Patent Application No. 2010-173381, filed Aug. 2, 2010, the entirety of which is hereby incorporated by reference.

BACKGROUND

1. Technical Field

The present invention relates to optical articles for use in optical materials and products, including lenses such as an eyeglass lens, and to methods for producing such optical articles.

2. Related Art

A known variation of optical articles such as an eyeglass lens is one that includes various functional layers (films) formed on an optical base material. Known examples of such layers include a hardcoat layer that ensures durability for the optical base material, and an antireflection coating that prevents ghosts and flickers.

JP-A-2004-341052 discloses a technique intended to provide an antistatic optical element preferable for low-heat-resistant base material. Specifically, an optical element such as an eyeglass lens is described that includes an antireflection coating of a multilayer configuration formed on a plastic optical base material, and in which the antireflection coating includes a transparent conductive layer formed by ion-assisted vacuum vapor deposition, and other layers formed by methods such as electron beam vacuum vapor deposition. The conductive layer is described as being a material such as indium, tin, and zinc, or an inorganic oxide of two or more of such components, particularly preferably indium tin oxide (ITO).

It is known to form a conductive layer of a certain thickness on the layer formed on the optical base material, in order to impart conductivity for antistatic and electromagnetic shielding purposes. An ITO (Indium Tin Oxide) layer is a common example of such a conductive layer. A problem of ITO, however, is that it is relatively expensive, and raises the manufacturing cost.

Further, the addition of a conductive layer of a certain thickness for the film or layer (for example, a multilayer antireflection coating) produced according to the predetermined optical or film design necessitates a new optical design or film design.

SUMMARY

An aspect of the invention is directed to an optical article that includes: an optical base material; and a translucent first layer that contains $TiO_x$ ($0<x\leq2$), and the first layer is formed on the optical base material either directly or via some other layer, and first layer has an argon concentration higher on a surface side of the first layer than on a optical base material side (deeper portion) of the first layer.

The present inventors found that the $TiO_x$ ($0<x\leq2$)-containing translucent first layer having a higher argon concentration on the surface layer side has both translucency and conductivity, and can impart antistatic performance and/or electromagnetic shielding performance to the optical article. According to this aspect of the invention, an optical article, such as an eyeglass lens, that has antistatic performance and/or or electromagnetic shielding performance, with or without the lamination of ITO (Indium Tin Oxide) is provided.

The optical article is typically one in which an argon peak appears on the surface side in a spectrum obtained by secondary ion mass spectrometry (SIMS) performed for the first layer along a depth direction from the surface of the first layer. The optical article may be such that a spectrum corresponding to an atomic weight of argon atoms in the first layer after being normalized by a spectrum in the optical base material side of the first layer in SIMS analysis has a peak that appears on the surface side.

In the optical article, the argon atom concentration on the surface side of the first layer is preferably at least 2.0% as measured by X-ray photoelectron spectroscopy (XPS), because it helps produce the antistatic effect. The argon atom concentration on the surface side of the first layer as measured by XPS is preferably 2.2% or more, more preferably 2.5% or more.

Further, in the optical article, the first layer has a thickness of preferably at least 4 nm, because it helps produce the antistatic effect. The thickness of the first layer is more preferably 5 nm or more, more preferably 8 nm or more.

The first layer may be a single layer, or one of or more than one of the layers of a multilayer structure layer. The multilayer structure layer is typically a multilayer antireflection coating. The optical article may include a multilayer antireflection coating, and the first layer may be a layer included in the multilayer antireflection coating. The optical article may further include an antifouling layer formed on the first layer either directly or via some other layer.

The optical base material is typically a plastic lens base material. One form of the optical article is an eyeglass lens, and another aspect of the invention is directed to eyeglasses that include an eyeglass lens, and a frame attached to the eyeglass lens.

Still another aspect of the invention is directed to an optical article production method.

The method includes: forming a $TiO_2$-containing translucent target layer on the optical base material either directly or via some other layer; and ionizing and bombarding a mixed gas of argon gas and oxygen gas on a surface of the target layer.

The method enables the target layer to be changed (converted) to a $TiO_x$ ($0<x\leq2$)-containing translucent first layer that has an argon concentration higher on the surface side of the first layer than on the optical base material side of the first layer, and can thus produce an optical article provided with such a first layer. The method thus enables the production and supply of an optical article that has sufficient translucency for articles such as eyeglass lenses, and antistatic performance and/or electromagnetic shielding performance.

In the optical article producing method, the target layer may be one of the layers included in the multilayer antireflection coating. Further, the optical article producing method may include forming an antifouling layer on the bombarded target layer, specifically, on the first layer, either directly or via some other layer.

In the optical article production method, it is preferable that the mixed gas be bombarded for 30 seconds to 300 seconds (hereinafter, "irradiation time"). It becomes difficult to obtain antistatic performance with an irradiation time below 30 seconds. An irradiation time above 300 seconds (5 min) is not preferable, because it may increase the temperature of the optical base material too high, and raises the manufacturing cost of the optical article. The irradiation time is more preferably 100 seconds to 300 seconds, further preferably 120 seconds to 300 seconds.

The ratio of the argon gas and the oxygen gas in the mixed gas (mixture ratio) contained in the mixed gas is preferably 10:1 to 1:2. Transparency lowers with a mixture ratio above 10:1. With a mixture ratio below 1:2, it becomes difficult to obtain antistatic performance. More preferably, the mixture ratio ranges from 5:1 to 1:1.

BRIEF DESCRIPTION OF THE DRAWINGS

The invention will be described with reference to the accompanying drawings, wherein like numbers reference like elements.

FIG. 3 is a diagram representing antireflection coating structures of samples that include antireflection coatings of $ZrO_2/SiO_2$ (a total of five layers in each antireflection coating).

FIG. 4 is a diagram summarizing the producing conditions and the evaluation results for the conduction processing layer included in the antireflection coating.

FIG. 7 is a diagram summarizing the producing conditions and the evaluation results for XPS analysis samples.

FIGS. 8A and 8B are diagrams representing XPS analysis results, in which FIG. 8A represents an Ar2p spectrum, and FIG. 8B represents a Ti2p spectrum.

FIG. 13 summarizes the producing conditions and the evaluation results for samples of other Examples.

FIG. 15A is a diagram representing an example of ion bombardment of a second layer; FIG. 15B is a diagram representing an example of ion bombardment of a sixth layer.

FIG. 16A is a diagram summarizing the producing conditions and the evaluation results for the samples of the Example and Comparative Example represented in FIG. 15A; FIG. 16B is a diagram summarizing the producing conditions and the evaluation results for the samples of the Example and Comparative Example represented in FIG. 15B.

DESCRIPTION OF EXEMPLARY EMBODIMENTS

The following describes an eyeglass lens as an example of an optical article. It should be noted, however, that the optical article to which the invention is applicable is not limited to the one described below.

Figure 1:
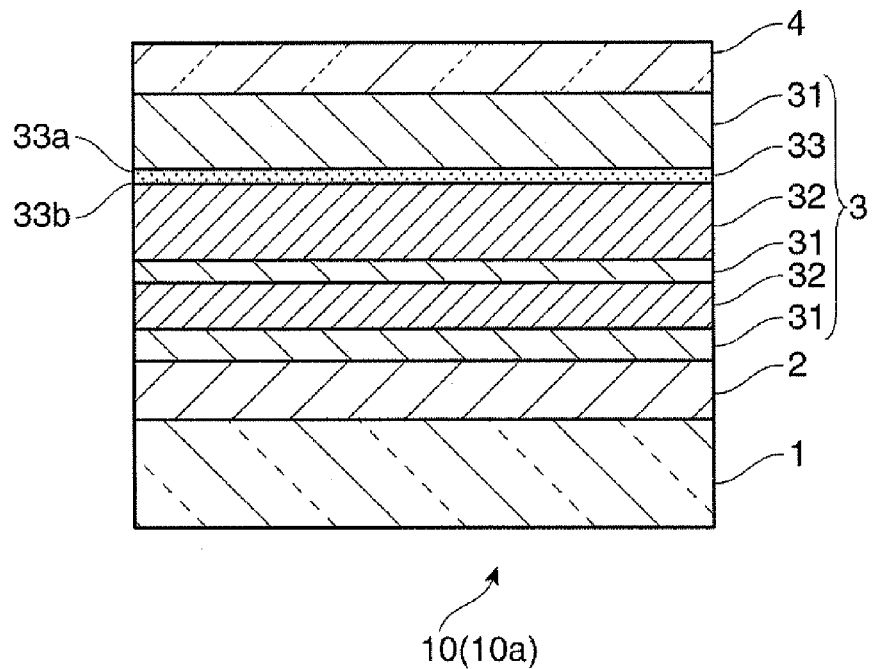
FIG. 1 is a cross sectional view illustrating a structure of a lens that includes a multilayer antireflection coating.

FIG. 1 shows a cross sectional configuration of a lens of an embodiment of the invention on one side of the lens relative to the base material at the center. A lens (optical article) 10 includes a lens base material (optical base material) 1, a hardcoat layer 2 formed on a surface of the lens base material 1, a translucent, multilayer antireflection coating 3 formed on the hardcoat layer 2, and an antifouling layer 4 formed on the antireflection coating 3. The antireflection coating 3 includes a conduction processing layer (first layer) 33 formed on the optical base material 1 via the hardcoat layer 2 and the other layers of the antireflection coating 3. The first layer 33 is a translucent layer that contains $TiO_x$ ($0 < x \leq 2$). The argon concentration of the first layer 33 is higher on a surface side (surface region) 33a than in a deeper portion (optical base material side) 33b of the first layer 33.

The first layer 33 containing $TiO_x$ ($0 < x \leq 2$), and having an argon concentration higher in the surface region 33a than in the deeper portion (optical base material side) 33b has sufficient levels of translucency for eyeglass lenses, and is conductive with a low sheet resistance. The first layer 33 can typically be produced using a producing method that includes: (1) forming a $TiO_2$-containing translucent target layer on the optical base material, either directly or via some other layer; and (2) ionizing and bombarding a mixed gas of argon gas and oxygen gas on a surface of the target layer.

The present inventors speculate that the ionization and bombardment of the mixed gas of argon gas and oxygen gas on the surface of the $TiO_2$-containing target layer forms the first layer 33 with oxygen defects (oxygen losses) in the surface region 33a, and that the oxygen losses in the surface region 33a serve as carriers to develop conductivity. Further, because the mixed gas contains both argon gas and oxygen gas, the ionization and bombardment of the mixed gas is believed to appropriately correct the argon ion-induced oxygen losses by the presence of oxygen ions, and thus suppress a large decrease in light transmittance. Further, the conductivity of the surface region 33a is presumably maintained by certain concentrations of argon atoms captured in the surface region 33a. It is thus believed that the presence of argon atoms creates oxygen defects (oxygen losses) in the surface region 33a of the first layer 33, and lowers the sheet resistance by transforming the $TiO_2$ to $TiO_x$ ($0 < x \leq 2$), for example, $TiO_{1.7}$ having conductivity, in at least portions of the surface region 33a.

Further in the lens (optical article) 10, while the argon concentration is high in the surface region 33a of the first layer 33, the argon concentration in the deeper portion 33b of the first layer 33 is either low or zero. The oxygen loss region is thus confined only within the surface region 33a, and is unlikely to affect the translucency of the first layer 33. The oxygen defect is also expected to improve conductivity (lower the sheet resistance).

It is often the case that the properties of metal oxides change greatly depending upon nonstoichiometric oxygen compositions, and metal atoms fewer than in stoichiometric proportion may form oxygen vacancy and improve conductivity. On the other hand, the increased distortion or oxygen vacancy may form a color center and absorb light to impart color or change the refractive index of the layer, lowering translucency. For this reason, it is difficult to obtain only the conductivity improving effect. In the lens 10 and the lens manufacturing method, the oxygen defects (oxygen losses) are introduced only at the surface region 33a by the ionization and bombardment of the argon and oxygen mixed gas on the surface of the target layer. In this way, conductivity can be improved while suppressing the adverse effects on the optical and/or physical characteristics of the layer structure.

The effects of bombarding the ionized gas tend to diminish with time, for example, as the defect recovers. However, in the lens 10 and the lens manufacturing method, the ionization and bombardment of the mixed gas of argon and oxygen on the target layer surface is believed to allow the argon to remain in the surface region 33a over extended time periods. The low surface-resistance state of the first layer 33 achieved by the ionization and bombardment of the mixed gas (low-resistance process, conduction process) is therefore maintained for a long time. The lens (optical article) 10 produced thus has superior optical characteristics and further improved conductivity.

Specifically, the deterioration of antistatic performance and/or electromagnetic shielding performance proceeds at a very slow rate in the lens 10, and thus the lens can have long-lasting antistatic performance and/or electromagnetic shielding performance. This is considered to be due to the argon being localized in the surface region 33a of the first layer 33 over extended time periods, causing a localized internal stress increase in the first layer 33, and thus suppressing recombinations of oxygen losses, or forming localized levels.

Another advantage is that the use of ITO is not necessary for obtaining antistatic performance and/or electromagnetic shielding performance. ITO (Indium Tin Oxide) is known as a material with transparency and a low electrical resistance. However, In (indium) is a scarce metal (rare metal), and is expensive. Further, because the ITO easily dissolves in acids and alkalis, the use of ITO for eyeglass lenses and other optical articles requiring environment adaptability is not desirable.

The first layer 33 containing $TiO_x$ ($0<x\leq2$) withstands acids and alkalis. Thus, the lens 10, in addition to being antistatic, can have strong resistance to acids and alkalis such as in sweat, all at low cost. The optical article provided by the embodiment of the invention may include an ITO layer. However, because conductivity can be imparted without an ITO layer, the lens 10 can be provided at low cost, and can be used in a wide variety of environments.

The following embodiments will be described through the case where $TiO_x$ is formed within $TiO_2$ by cutting the $TiO_2$ bonds through irradiation of a several nanometer deposited layer of $TiO_2$ with an argon and oxygen ion beam having an energy of several hundred electronvolts. The following embodiments also describe producing an antistatic optical article with the $TiO_x$ serving as carriers to develop conductivity. Though it is desirable to reduce the thickness of $TiO_x$ for transparency, a thin $TiO_x$ is unstable, and lowers conductivity as a result of, for example, defect recombinations. Thus, the following describes the conditions for maintaining a stable antistatic property over extended time periods. Further, several conditions suited for antistatic eyeglass lens applications will be described through the improvement of durability realized by preventing recombinations with appropriate numbers of argon atoms near the losses.

First Embodiment

1. Overview of Lens 1.1 Lens Base Material

The lens base material 1 is not particularly limited, and may be (meth)acrylic resin. Other examples include allyl carbonate resin such as styrene resin, polycarbonate resin, allyl resin, and diethylene glycol bis(allyl carbonate) resin (CR-39); urethane resin obtained by the reaction of vinyl resin, polyester resin, polyether resin, or an isocyanate compound with a hydroxy compound such as diethylene glycol; thiourethane resin as the product of a reaction between an isocyanate compound and a polythiol compound; and transparent resin obtained by curing a polymerizable composition that contains a (thio)epoxy compound having one or more disulfide bonds within the molecule. The refractive index of the lens base material 1 is, for example, about 1.60 to 1.75. The refractive index of the lens base material 1 is not limited to this, and may be above or below this range.

1.2 Hardcoat Layer (Primer Layer)

The hardcoat layer 2 formed on the lens base material 1 is provided to impart abrasion resistance to the lens 10 (lens base material 1), or to increase the strength of the lens 10 (lens base material 1). Examples of the material usable for the hardcoat layer 2 include acrylic resin, melamine resin, urethane resin, epoxy resin, polyvinyl acetal resin, amino resin, polyester resin, polyamide resin, vinyl alcohol resin, styrene resin, silicon resin, and mixtures or copolymers of these.

For example, the hardcoat layer 2 is silicon resin. The hardcoat layer 2 can be formed by, for example, applying and curing a coating composition that contains metal oxide fine particles, and a silane compound. The coating composition may also include components such as colloidal silica, and a polyfunctional epoxy compound.

Specific examples of the metal oxide fine particles contained in the coating composition include fine particles of metal oxides such as $SiO_2$, $Al_2O_3$, $SnO_2$, $Sb_2O_5$, $Ta_2O_5$, $CeO_2$, $La_2O_3$, $Fe_2O_3$, $ZnO$, $WO_3$, $ZrO_2$, $In_2O_3$, and $TiO_2$, and composite fine particles of metal oxides of two or more metals. A colloidal dispersion of such fine particles in a dispersion medium (for example, water, alcohol, and other organic solvents) may be mixed with the coating composition.

A primer layer may be provided between the lens base material 1 and the hardcoat layer 2 to ensure adhesion between the lens base material 1 and the hardcoat layer 2. The primer layer is also effective at improving the impact resistance, a drawback of high-refractive-index lens base material. Examples of the material used for the primer layer (resin used to form the base of the primer layer) include acrylic resin, melamine resin, urethane resin, epoxy resin, polyvinyl acetal resin, amino resin, polyester resin, polyamide resin, vinyl alcohol resin, styrene resin, silicon resin, and mixtures or copolymers of these. Urethane resin and polyester resin are preferable as the primer layer used to provide adhesion.

Typically, the hardcoat layer 2 and the primer layer can be formed by applying a coating composition using a dipping method, a spinner method, a spray method, or a flow method, followed by heating and drying at a temperature of 40 to 200° C. for several hours.

1.3 Antireflection Coating

Typically, the antireflection coating 3 formed on the hardcoat layer 2 is an inorganic antireflection coating or an organic antireflection coating. The lens 10 of the present embodiment includes an inorganic antireflection coating.

The inorganic antireflection coating is typically configured as a multilayer film. The multilayer antireflection coating can be formed by, for example, alternately laminating a low-refractive-index layer having a refractive index of 1.3 to 1.6 and a high-refractive-index layer having a refractive index of 1.8 to 2.6. The number of layers is preferably about 5 to 7.

Examples of the inorganic material used for each layer of the antireflection coating include $SiO_2$, $SiO$, $ZrO_2$, $TiO_2$, $TiO$, $Ti_2O_3$, $Ti_2O_5$, $Al_2O_3$, $TaO_2$, $Ta_2O_5$, $NdO_2$, $NbO$, $Nb_2O_3$, $NbO_2$, $Nb_2O_5$, $CeO_2$, $MgO$, $Y_2O_3$, $SnO_2$, $MgF_2$, $WO_3$, $HfO_2$, and $Y_2O_3$. These inorganic materials may be used either alone or as a mixture of two or more.

The method (producing method) used to form the antireflection coating 3 may be a dry method, for example, such as a vacuum vapor deposition method, an ion plating method, and a sputtering method. The vacuum vapor deposition method may use an ion beam-assisted method, in which an ion beam is simultaneously shone during the vapor deposition.

An organic antireflection coating may be formed in place of the inorganic antireflection coating 3. A wet method may be used as the method (producing method) of forming the organic antireflection coating. The organic antireflection coating may also be formed by, for example, coating a antireflection coating composition that contains (i) silica fine particles having inner cavities (hereinafter, also referred to as "hollow silica fine particles"), and (ii) an organosilicon compound, using the same methods used to form the hardcoat layer and the primer layer. The reason the hollow silica fine particles are used for the antireflection coating coating composition is that the inner cavities contain a gas or a solvent of lower refractive index than that of silica, and that the lower refractive index than that of silica fine particles having no cavities provides superior antireflection effects. The hollow silica fine particles can be produced using, for example, the method described in JP-A-2001-233611. Preferably, hollow silica fine particles having an average particle size of 1 to 150 nm, and a refractive index of 1.16 to 1.39 are used. The thickness of the organic antireflection coating is preferably 50 to 150 nm.

1.3.1 Conduction Process

The antireflection coating 3 includes the first layer 33. The first layer 33 contributes to making the lens 10 conductive (low resistant). In the following, the first layer 33 will be referred to as conduction processing layer 33. The first layer 33 may also be called a conduction layer, or a low-resistance layer. The basic composition of the conduction processing layer 33 is $TiO_x$ ($0<x\leq2$). When the combination of the high-refractive-index layer and the low-refractive-index layer in the antireflection coating 3 is $TiO_2/SiO_2$, the conduction processing layer (first layer) 33 is formed (configured) on the surface layer of any of the high-refractive-index layers. When the combination of the high-refractive-index layer and the low-refractive-index layer in the antireflection coating 3 is, for example, $ZrO_2/SiO_2$, $Ta_2O_5/SiO_2$, $NdO_2/SiO_2$, $HfO_2/SiO_2$, or $Al_2O_3/SiO_2$, the conduction processing layer (first layer) 33 is formed on at least one of the layers, typically by being laminated on the surface of at least one of the high-refractive-index layers. The conduction processing layer (first layer) 33 also may be formed by being laminated on the surface of the organic antireflection coating to lower surface resistance.

The lens 10 includes the multilayer antireflection coating 3 as a laminate of a low-refractive-index layer 31 ($SiO_2$) and a high-refractive-index layer 32 ($ZrO_2$). Basically, the antireflection coating 3 has a 5-layer structure including alternately laminated three low-refractive-index layers 31 and two high-refractive-index layers 32. The conduction processing layer 33 is thus formed by being laminated on any of the high-refractive-index layers 32 ($ZrO_2$) of different compositions. In the example below, the conduction processing layer 33 is provided between the uppermost low-refractive-index layer (fifth layer) 31 and the uppermost high-refractive-index layer (fourth layer) 32. Specifically, the antireflection coating 3 of basically a 5-layer structure can be said to have a 6-layer structure with the conduction processing layer 33.

The conduction processing layer 33 of the lens 10 is a translucent layer of $TiO_x$ ($0<x\leq2$), containing more argon on the surface side (surface region) 33a. The proportion x in the composition $TiO_x$ ($0<x\leq2$) of the conduction processing layer 33 is not required to be constant throughout the conduction processing layer 33. It is assumed that the surface region 33a contains relatively larger amounts of $TiO_{x1}$ ($x1\approx1.7$ to 1.8), and that the deeper portion (base material 1 side) 33b contains relatively larger amounts of $TiO_{x2}$ ($x2\approx2.0$). The argon concentration is higher in the surface region 33a than in the deeper portion 33b, forming a concentration gradient or concentration steps in the conduction processing layer 33.

The conduction processing layer 33 argon-rich on the surface can be produced using a producing method that includes: forming a target layer that contains the main component $TiO_2$; and ionizing and bombarding a mixed gas of argon gas and oxygen gas on the target layer surface.

The ionization and bombardment of the mixed gas of argon gas and oxygen gas is important. The bombardment of the ionized argon gas forms the conduction processing layer 33 that has the surface region 33a of high argon concentration, and the bombardment of the ionized oxygen gas repairs the bombardment-induced defects in surface region 33a to some extent to suppress large deterioration of optical performance. Further, because the detects in the surface region 33a are repaired to some extent, the argon (atoms) can be confined in a stable fashion in the surface region 33a, and the electrical properties of the conduction processing layer 33 can remain stable over extended time periods.

Specifically, the ionization and bombardment of the mixed gas of argon gas and oxygen gas causes the oxygen atoms in some of the $TiO_2$ in the surface region 33a of the target $TiO_2$ layer to separate or leave, making the stoichiometric ratio of the metal and oxygen atoms out of proportion from the composition of the predetermined compound (creating a nonstoichiometric composition). This is believed to create oxygen defects (oxygen losses) in the surface region 33a, the oxygen losses serving as carriers to develop conductivity (lower the sheet resistance). Further, because the argon remains in the localized state in the surface region 33a, recombinations of oxygen losses can be suppressed, or localized levels are formed. There accordingly will be no decrease in conductivity with time, if any. The inclusion of the conduction processing layer 33 thus imparts antistatic performance to the antireflection coating 3, and the antistatic performance is maintained over extended time periods. Further, the oxygen loss region in the conduction processing layer 33 is confined only in the surface region 33a, and thus has only small influence on the optical performance of the antireflection coating 3.

Changes in argon concentration in the conduction processing layer 33 can be measured by secondary ion mass spectrometry (SIMS) performed along the depth direction from the surface of the conduction processing layer 33. The analysis method is not limited to this, and any method can be used as long as it is recognized as being effective for analytical purposes. Specific values of argon concentration can be measured by using, for example, X-ray photoelectron spectroscopy (XPS).

The thickness of the conduction processing layer 33 is not particularly limited, as long as it does not affect the performance of the high-refractive-index layers 32. When the composition of the high-refractive-index layers 32 is not based on titanium oxide, the conduction processing layer 33 preferably has a thickness of 4 nm or more, in order to obtain the effect of the conduction process by the bombardment of the ionized mixed gas, and to contain appropriate concentrations of argon in the surface region 33a. In this case, the thickness of the conduction processing layer 33 is preferably 15 nm or less, because when too thick, it may increase the optical absorption loss.

1.4 Antifouling Layer

A water-repellent film or a hydrophilic anti-fog film (antifouling layer) 4 is often formed on the antireflection coating 3. For example, the antifouling layer 4 is formed as a layer of a fluorine-containing organosilicon compound on the antireflection coating 3 to improve the water-repellency and oil-repellency of the surface of the optical article (lens) 10. Preferably examples of the fluorine-containing organosilicon compound include fluorine-containing silane compounds.

Preferably, the fluorine-containing silane compound is dissolved in an organic solvent, and used as a water-repellent treatment liquid adjusted to a predetermined concentration (antifouling layer-forming coating composition). The antifouling layer can be formed by applying the water-repellent treatment liquid (antifouling layer-forming coating composition) on the antireflection coating. The method may be, for example, a dipping method, or a spin coating method. The antifouling layer also may be formed by a dry method such as a vacuum vapor deposition method, using the water-repellent treatment liquid (antifouling layer-forming coating composition) charged into a metal pellet.

The thickness of the antifouling layer 4 having water- and oil-repellency is not particularly limited, and is preferably from 0.001 to 0.5 µm, more preferably from 0.001 to 0.03 µm. It is not preferable to make the thickness of the antifouling layer 4 too thin, because it diminishes the water-repelling and oil-repelling effect, or to make it too thick as it makes the surface tacky. A thickness of the antifouling layer 4 above 0.03 µm may lower the antireflection effect.

2. Sample Production

Type A

Samples of the antireflection coating 3 of the $ZrO_2/SiO_2$ five-layer structure including the conduction processing layer 33 were produced. FIG. 3 summarizes the structure of each antireflection coating 3 of Examples and Comparative Examples. FIG. 4 summarizes the conditions used to produce each conduction processing layer 33 of Examples and Comparative Examples, and the evaluation results for these layers.

2.1 Example 1

Sample S1

2.1.1 Selection of Lens Base Material and Deposition of Hardcoat Layer

An eyeglass plastic lens base material (refractive index 1.67; Seiko Super Sovereign (SSV); Seiko Epson) was used as the lens base material 1.

The application liquid (coating liquid) for forming the hardcoat layer 2 was prepared as follows. 4.46 parts by weight of an acid anhydride hardener (hardener liquid (C2); Arakawa Chemical Industries, Ltd.) was added to 20 parts by weight of an epoxy resin-silica hybrid (Compoceran E102; Arakawa Chemical Industries, Ltd.), and the mixture was stirred to obtain the application liquid (coating liquid, coating solution). The coating solution was then applied on the lens base material 1 in a predetermined thickness using a spin coater. The lens base material 1 with the coating was calcined at 125° C. for 2 hours to deposit the hardcoat layer 2.

2.1.2 Deposition of Antireflection Coating

The antireflection coating 3 (type A) for the lens sample S1 of Example 1 was deposited. In the following, the sample of each Example will be referred to as sample "alphabet and numeral" (e.g. sample S1), and the term "sample 10" will be used to collectively refer to the samples of Examples.

2.1.2.1 Vapor Deposition Apparatus

Figure 2:
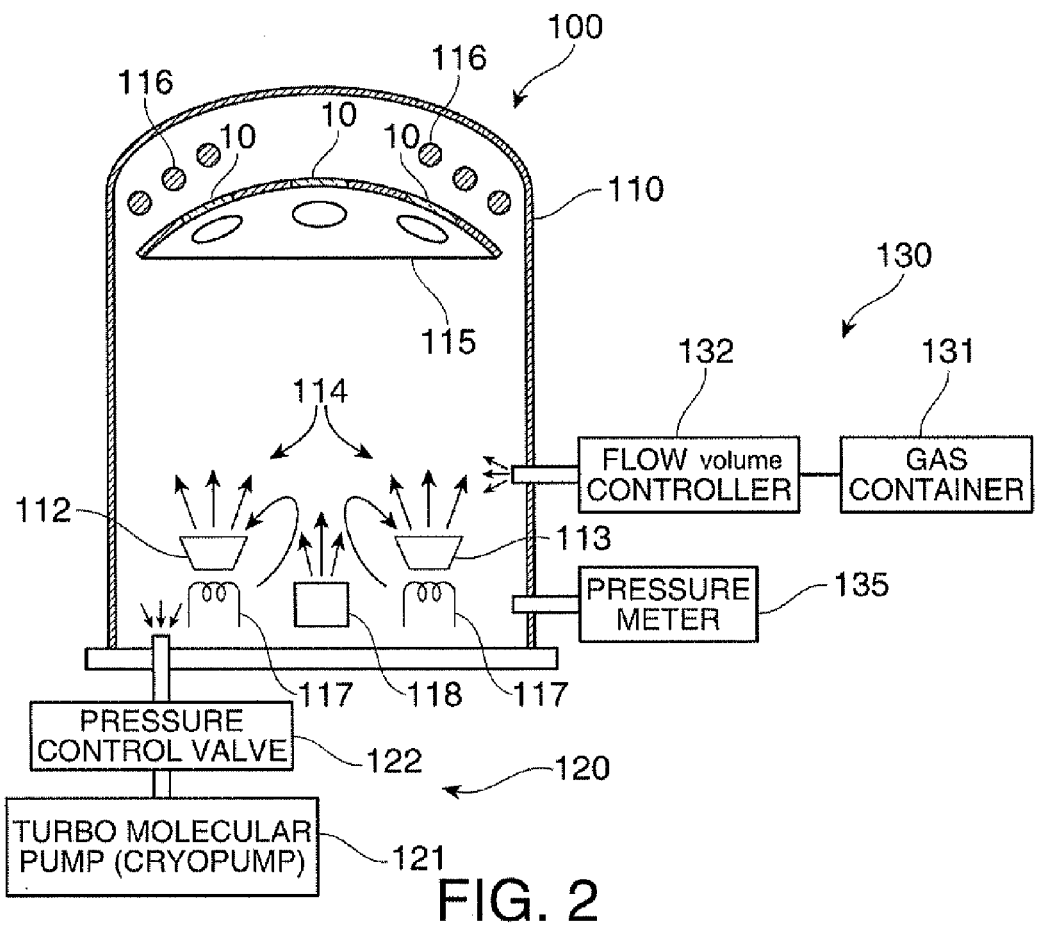
FIG. 2 is a diagram schematically illustrating a vapor deposition apparatus used to produce the antireflection coating.

FIG. 2 illustrates an example of a vapor deposition apparatus 100 that can be used to continuously produce (deposit) the inorganic multilayer antireflection coating 3, and the conduction processing layer 33 provided in the antireflection coating 3. The vapor deposition apparatus 100 is an electron beam vapor deposition apparatus, and includes a vacuum vessel 110, an evacuator 120, and a gas supply unit 130. The vacuum vessel 110 includes a sample support 115 used to place the lens sample 10 with the hardcoat layer 2 formed (deposited) thereon, a base material-heating heater 116 used to heat the lens sample 10 set on the sample support 115, and filaments 117 that generate thermoelectrons. The base material-heating heater 116 is provided as, for example, an infrared lamp, and heats the lens sample 10 to remove gas or moisture, and thus ensures adhesion for the layer formed on the surface of the lens sample 10.

In the vapor deposition apparatus 100, an electron gun (not illustrated) bombards thermoelectrons 114 to the material (vapor deposition material) set in evaporation sources (crucibles) 112 and 113, causing the material to evaporate and vapor deposit on the lens sample 10.

The vapor deposition apparatus 100 also includes an ion gun 118 for ion-assisted vapor deposition. For this purpose, the ion gun 118 ionizes and accelerates the gas introduced into the vacuum vessel 110 for bombardment onto the lens sample 10. The vacuum vessel 110 may be provided with devices such as a cold trap used to remove the remaining moisture, and a device used to control the thickness. Examples of thickness control device include a reflection-type optical thickness meter, and a crystal oscillator thickness meter.

Inside the vacuum vessel 110 may be maintained at a high vacuum, for example, $1\times10^{-4}$ Pa, using a turbo molecular pump or a cryopump 121, and a pressure control valve 122 provided in the evacuator 120. A predetermined gas atmosphere also may be created inside the vacuum vessel 110 using the gas supply unit 130. For example, the gas supply unit 130 includes a gas container 131 ready to supply gases such as argon (Ar), nitrogen ($N_2$), and oxygen ($O_2$). The gas flow volume can be controlled using a flow volume controller 132. The pressure inside the vacuum vessel 110 can be controlled using a pressure meter 135.

Thus, the vapor deposition conditions of the vapor deposition apparatus 100 basically include vapor deposition material, the acceleration voltage and the current value of the electron gun, and the presence or absence of ion assistance. The conditions for ion assistance depend on the type of ions (atmosphere of the vacuum vessel 110), and the voltage and current values of the ion gun 118. In the following, the acceleration voltage and the current value of the electron gun are selected from the 5 to 10 kV range and the 50 to 500 mA range, respectively, according to such factors as the deposition rate, unless otherwise specified. When using ion assistance, the voltage value and the current value of the ion gun 118 are selected from the 200 V to 1 kV range and the 100 to 500 mA range, respectively, according to such factors as the deposition rate.

2.1.2.2 Pretreatment

The lens sample 10 with the hardcoat layer 2 was washed with acetone. The moisture attached to the lens sample 10 was evaporated by a heat treatment performed at about 70° C. inside the vacuum vessel 110. This was followed by the ion cleaning of the surface of the lens sample 10. Specifically, an oxygen ion beam was shone on the surface of the lens sample 10 at a several hundred electronvolt energy using the ion gun 118 to remove the organic material adhered on the surface of the lens sample 10. This process (method) can also improve the adhesion of the layer (film) formed on the surface of the lens sample 10. The same process may be performed using inert gas, for example, such as argon (Ar) gas and xenon (Xe) gas, or using nitrogen ($N_2$), instead of oxygen ions. Irradiation of oxygen radicals or oxygen plasma is also possible.

2.1.2.3 Deposition of Low-Refractive-Index Layers (First Layer, Third Layer, Fifth Layer) and High-Refractive-Index Layers (Second Layer, Fourth Layer)

After the thorough vacuum evacuation of the vacuum vessel 110, the low-refractive-index layers 31 and the high-refractive-index layers 32 were alternately laminated to produce the antireflection coating 3, using an electron beam vacuum vapor deposition method. In the lens sample S1 of Example 1, silicon dioxide ($SiO_2$) layers were formed as the low-refractive-index layers 31, and zirconium oxide ($ZrO_2$) layers were formed as the high-refractive-index layers 32.

As presented in FIG. 3, the first layer, the third layer, and the fifth layer represent the low-refractive-index layers 31, and the $SiO_2$ layers were deposited by vacuum vapor deposition without ion assistance. The deposition rate was 2.0 nm/sec, and the acceleration voltage and the current of the electron gun were 7 kV and 100 mA, respectively. The first layer, the third layer, and the fifth layer were controlled to have thicknesses of 29 nm, 16 nm, and 91 nm, respectively.

The second layer and the fourth layer represent the high-refractive-index layers 32, and were deposited as $ZrO_2$ layers by the heat evaporation of tablet $ZrO_2$ sintered material using an electron beam. The deposition rate was 0.8 nm/sec. The second layer and the fourth layer were controlled to have thicknesses of 40 nm and 60 nm, respectively.

2.1.2.4 Deposition of Conduction Processing Layer

The conduction processing layer 33 was deposited after the deposition of the fourth layer ($ZrO_2$) 32, before depositing the fifth layer ($SiO_2$) 31.

First, the target $TiO_2$ layer (thickness, 8 nm) was deposited on the fourth layer by ion-assisted vapor deposition with the introduced oxygen gas. The deposition rate was 0.4 nm/sec, the voltage of the irradiated ion beam (ion acceleration voltage) was 500 V, and the ion beam current was 200 mA. Oxygen gas ($O_2$ gas; 35 sccm) was used as the introduced gas to the ion gun. Oxygen gas ($O_2$ gas; 15 sccm) was also used as the introduced gas to the vacuum vessel (chamber) 110.

Thereafter, a mixed gas of argon gas and oxygen gas was ionized and bombarded on the surface of the target $TiO_2$ layer using the vapor deposition apparatus (vacuum vapor deposition apparatus) 100 to alter the target $TiO_2$ layer to the conduction processing layer 33. The gas introduced to the ion gun is the mixed gas of argon gas and oxygen gas, and contains 16.5 sccm of argon gas (Ar gas), and 3.5 sccm of oxygen gas ($O_2$ gas) (a mixture ratio of about 4.7:1). The irradiation (process) was performed for 30 seconds with the 800-V of the irradiated ion beam (ion acceleration voltage) and the 200-mA ion beam current.

2.1.3 Deposition of Antifouling Layer

After the oxygen plasma treatment of the lens sample 10 provided with the antireflection coating 3, a pellet material containing "KY-130" (Shin-Etsu Chemical Co., Ltd.) that contains a large-molecular-weight fluorine-containing organosilicon compound was used as the deposition source and heated at about 500° C. in the vacuum vessel 110 to evaporate the KY-130 and deposit the antifouling layer 4 on the antireflection coating 3 (on the final $SiO_2$ layer 31 of the antireflection coating 3). The vapor deposition time was about 3 minutes. By the oxygen plasma treatment, silanol groups are created on the surface of the final $SiO_2$ layer 31, and the chemical adhesion (chemical bonding) between the antireflection coating 3 and the antifouling layer 4 can be improved.

After the vapor deposition, the lens sample 10 was taken out of the vacuum vapor deposition apparatus 100, flipped over, and placed in the apparatus again, where the steps 2.1.2.2 to 2.1.2.4 and the step 2.1.3 were repeated in the same procedure to deposit the antireflection coating 3 and the antifouling layer 4. The lens sample 10 was then taken out of the vacuum vapor deposition apparatus 100. The resulting lens sample S1 of Example 1 thus included the hardcoat layer 2, the antireflection coating 3 (type A1), and the antifouling layer 4 on each side of the lens base material 1.

2.2 Examples 2 and 3

Samples S2 and S3

Samples S2 and S3 of Examples 2 and 3 were produced in the same manner as in sample S1 of Example 1. Note, however, that the irradiation time of the ionized mixed gas in the conduction processing layer-forming step 2.1.2.4 was 120 seconds for sample S2 of Example 2. For sample S3 of Example 3, the irradiation time of the ionized mixed gas in the conduction processing layer-forming step 2.1.2.4 was 240 seconds. The other conditions for these samples are the same as in Example 1.

2.3 Comparative Examples 1 and 2

Samples R1 and R2

Samples R1 and R2 of Comparative Examples 1 and 2 were produced for comparison with the samples obtained in Examples. Sample R1 of Comparative Example 1 was produced by depositing a $TiO_y$ (y=1.7) layer (thickness, 8 nm) in place of the $TiO_2$ layer and without the bombardment of ionized gas (no ion-assisted vapor deposition) in the conduction processing layer-forming step 2.1.2.4.

Specifically, vapor deposition material (Patinal Titanium Oxide S $TiO_{1.7}$; MERCK) was used. The material was melted and evaporated in a vacuum (in the vacuum vessel 110) by electron beam heating. The acceleration voltage and the current of the electron gun were 6 kV and 270 mA, respectively. No gas was introduced to the chamber (vacuum vessel) 110, and ion assistance was not used. The conduction processing layer was deposited only with a $TiO_{1.7}$ steam, and the deposition of a 8-nm thick $TiO_{1.7}$ film took 50 seconds.

Sample R2 of Comparative Example 2 was produced by ionizing and bombarding only the argon gas on the surface of the target $TiO_2$ layer in the conduction processing layer-forming step 2.1.2.4. Here, argon gas (Ar gas) was introduced to the ion gun in 20 sccm. All the other conditions for these samples are the same as in Example 1.

3. Evaluation of Samples S1 to S3 and Samples R1 to R2

The samples S1 to S3 and the samples R1 to R2 produced as above were measured for optical absorption loss and initial sheet resistance value, and the antistatic property (initial) and the durability of antistatic property were evaluated.

3.1 Light Absorption Loss

The samples S1 to S3 and the samples R1 to R2 were measured for optical absorption loss. The measurement of optical absorption loss is difficult in the presence of a curved surface. Thus, optical absorption loss was measured using samples prepared to include the conduction processing layer 33 in the antireflection coating 3, and the antifouling layer 4 formed in the steps described above, using parallel flat glass as the base material. The hardcoat layer was not deposited in these samples.

The optical absorption loss was found by calculating absorption from the measured reflectance and transmittance, according to the following equation (A). Spectrophotometer U-4100 (Hitachi) was used for the measurement.

$$\text{Absorption(absorption loss)}=100\%-\text{transmittance}-\text{reflectance} \quad (A)$$

In the following, the absorption is the absorption near 550 nm wavelength. FIG. 4 summarizes the measurement results. The values of optical absorption loss were 1% or less in Samples S1 to S3 of Examples 1 to 3 and in sample R1 of Comparative Example 1. It is thus believed that translucency is sufficiently high, and that there is no large influence on the translucency of the antireflection coating 3.

On the other hand, the value of optical absorption loss was as high as 2.26% in sample R2 of Comparative Example 2, in which only the argon gas was ionized and bombarded on the surface of the target $TiO_2$ layer. It was therefore found that the optical absorption loss could be reduced by the ionization and bombardment of the mixed gas of argon and oxygen.

3.2 Sheet Resistance

Figure 5A:
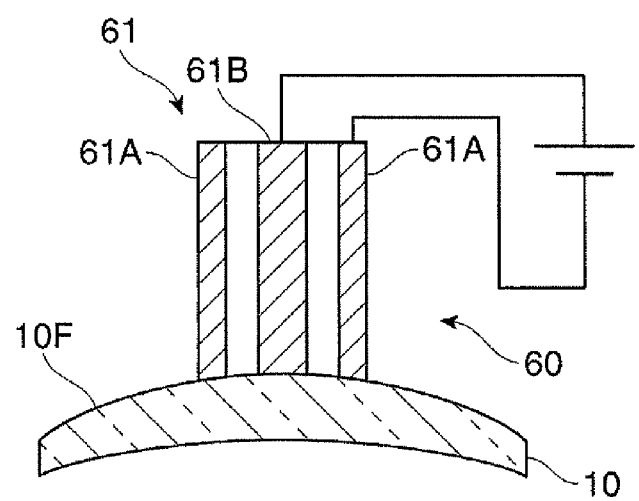
FIG. 5A is a cross sectional view showing how the sheet resistance of a sample surface is measured.
Figure 5B:
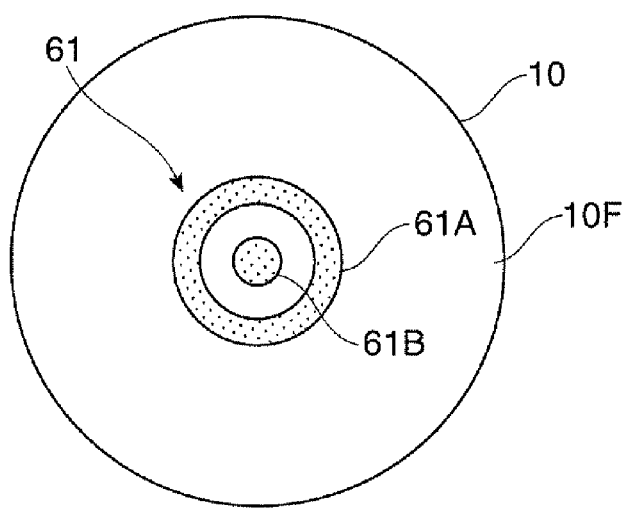
FIG. 5B is a plan view showing how the sheet resistance of a sample surface is measured.

The sheet resistances of samples S1 to S3 and samples R1 to R2 produced as above were measured immediately after the production (within 1 hour). FIGS. 5A and 5B show how the sheet resistance of each sample was measured. In this example, the sheet resistance on a surface 10F of the lens sample 10 was measured with a ring probe 61 in contact with the surface 10F of the lens sample 10 being measured. High-resistance resistivity meter Hiresta UP (Model MCP-HT450; Mitsubishi Chemical Corporation) was used as a measurement device 60. The ring probe 61 is of an URS type, and includes two electrodes. An outer ring electrode 61A has an outer diameter of 18 mm, and an inner diameter of 10 mm. An inner circular electrode 61B has a diameter of 7 mm. The sheet resistance of each sample was measured by applying a voltage of 100 V to 10,000 V between these electrodes.

FIG. 4 summarizes the measurement results. Samples S1 to S3 of Examples 1 to 3 had sheet resistances of $1\times10^{10}$ [Ω/□], $4\times10^{8}$ [Ω/□], and $3\times10^{8}$ [Ω/□], respectively. In contrast, the sheet resistance of sample R1 of Comparative Example 1 was $1\times10^{12}$ [Ω/□]. It was thus found that the conduction process by the ionization and bombardment of the mixed gas of argon gas and oxygen gas on the surface of the target $TiO_2$ layer could further lower the sheet resistance by about $1/10^2$ to $1/10^4$ from the sheet resistance of the $TiO_y$ (y=1.7) conduction processing layer said to have conductivity.

On the other hand, the sheet resistance of sample R2 of Comparative Example 2 was $6\times10^5$ [Ω/□], an even lower resistance. However, because the optical absorption loss was large, the use of the lens 10 may be limited to applications where a large optical absorption loss can be tolerated, for example, as in sunglasses.

Reducing the surface resistance (sheet resistance) of optical articles such as lenses is effective in some respects. The typical effect is the prevention of static charge and electromagnetic shielding. A sheet resistance of $1\times10^{12}$ [Ω/□] or less is regarded as the indicator that determines the presence or absence of antistatic property in eyeglasses lenses. Specifically, an eyeglasses lens can be deemed as being antistatic when it has a sheet resistance of $1\times10^{12}$ [Ω/□] or less.

Considering safety and other concerns during use, the sheet resistance measured by the foregoing method is more preferably $1\times10^{11}$ [Ω/□] or less. Samples S1 to S3 all have sheet resistances of $1\times10^{11}$ [Ω/□] or less as measured by the foregoing method, and are thus can be said as being safe for use, and having an excellent antistatic property. The antistatic property and the durability of antistatic property were evaluated as follows.

3.2.1 Antistatic Property (Initial)

The sheet resistance of each sample immediately after the production (on the day of fabrication) was evaluated according to the following criteria. The results are presented in FIG. 4.

Good: $1\times10^{11}$ [Ω/□] or less
Acceptable: In excess of $1\times10^{11}$ [Ω/□], $1\times10^{12}$ [Ω/□] or less
Poor: In excess of $1\times10^{12}$ [Ω/□]

According to these criteria, samples S1 to S3 of Examples 1 to 3 were evaluated as Good, sample R1 of Comparative Example 1 as Acceptable, and sample R2 of Comparative Example 2 as Good, showing that the samples all have antistatic property, including sample R1 of Comparative Example 1.

3.2.2 Durability of Antistatic Property

Each sample was stored in 60° C., 98% RH conditions, and changes (deterioration) in sheet resistance were examined. Specifically, the time for the sheet resistance of each sample to reach $1\times10^{12}$ [Ω/□] was measured, and the durability was determined according to the length of the measured time, according to the following criteria.

Excellent: 350 hours or more
Good: 250 hours or more, less than 350 hours
Acceptable: 100 hours or more, less than 250 hours
Poor: Less than 100 hours The durability was 100 hours or more in samples S1 to S3 of Examples 1 to 3, and 350 hours or more in samples S2 and S3 of Examples 2 and 3. The durability was not much different in this range, as demonstrated by sample R2 of Comparative Example 2 which also had a durability of 350 hours or more. In any case, it was found that the conduction processing layer 33 formed by the ionization and bombardment of the mixed gas of argon gas and oxygen gas on the surface of the target $TiO_2$ layer could lower sheet resistance, and provide the static charge preventing and electromagnetic shielding effects. These effects were also found to be long lasting.

3.3 Other Evaluations

Samples S1 to S3 of Examples 1 to 3 were evaluated for chemical resistance and swelling.

3.3.1 Chemical Resistance (Corrosion Resistance Against Acid and Alkali)

Chemical resistance was evaluated by observing the presence or absence of peeling of the antireflection coating from the sample surface immersed in a chemical solution after being scratched. More specifically, chemical resistance was evaluated after the abrasion step and chemical immersion step performed as follows.

(1) Abrasion Step

Four evaluation samples 10 were attached to the inner wall of a container (drum), and a nonwoven fabric and sawdust were placed in the container to create abrasion. The container was capped, and the drum was rotated at 30 rpm for 30 minutes.

(2) Chemical Immersion Step

A chemical solution mimicking human sweat was prepared (a solution of 50 g/L lactic acid and 100 g/L salt dissolved in deionized water). Samples 10 after the abrasion step (1) were then immersed for 100 hours in the chemical solution maintained at 50° C.

The samples after these steps were visually inspected, and compared with reference samples that did not go through the steps (1) and (2). Compared with the reference samples, hardly any scratch was observed in samples S1 to S3 of Examples 1 to 3, and in samples R1 and R2 of Comparative Examples 1 and 2. The level of transparency was also the same in the samples of Examples and Comparative Examples. It was therefore found that samples S1 to S3 and samples R1 and R2 all had desirable chemical resistance (corrosion resistance against acid and alkali).

3.3.2 Swelling (Moisture Resistance)

Moisture resistance was evaluated by a constant-temperature constant-humidity environment test. Specifically, samples S1 to S3 and samples R1 and R2 were left unattended in a constant-temperature constant-humidity environment (60° C., 98% RH) for 8 days, and evaluated according to the following criteria.

The presence or absence of swelling was determined by observing the reflected light off the front or back surface of each sample subjected to the constant-temperature constant-humidity environment test. Specifically, the fluorescence reflected light off the convex face of each sample was observed, and the sample was determined as having "no swelling" when clear, defined outlines were observed in the fluorescence reflected light image. On the other hand, the sample was determined as having "swelling" when the outlines of the fluorescence reflected light image appeared blurry or dim.

There was no swelling in samples S1 to S3 of Examples 1 to 3, and in samples R1 and R2 of Comparative Examples 1 and 2. Specifically, samples S1 to S3 of Examples 1 to 3, and samples R1 and R2 of Comparative Examples 1 and 2 were found to have desirable moisture resistance.

3.4 Evaluation Summary

It was found from the foregoing evaluations that samples S1 to S3 of Examples 1 to 3 had antistatic property and antistatic property durability, and the level of transparency sufficient for use as an article such as an eyeglass lens. Samples S2 and S3 of Examples 2 and 3 were found to be particularly durable in terms of antistatic property. From the foregoing, it is considered preferable that the mixed gas of argon gas and oxygen gas be ionized and bombarded on the surface of the target $TiO_2$ layer for 120 seconds or more (ion beam irradiation time) in the conduction process (2.1.2.4).

The state of the conduction processing layer 33 was confirmed by X-ray photoelectron spectroscopy (XPS), secondary ion mass spectrometry (SIMS), and reflectance measurement.

4. X-Ray Photoelectron Spectroscopy (XPS)

Figure 6:
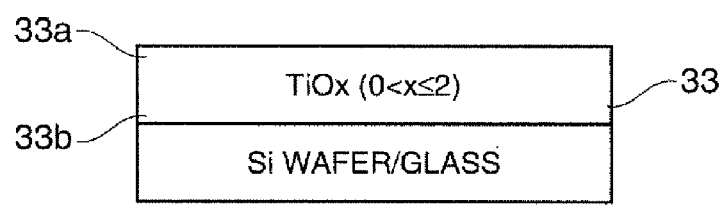
FIG. 6 is a diagram schematically illustrating a structure of a sample for XPS analysis.

Samples X1 to X3 for XPS analysis, corresponding to samples S1 to S3 of Example 1 to 3, were produced to confirm the argon concentration in the surface region 33a in the conduction processing layer 33 by XPS analysis. As illustrated in FIG. 6, samples X1 to X3 for XPS analysis were produced by forming the conduction processing layer 33 under the same deposition conditions (2.1.2.4) used for the conduction processing layers 33 of Examples 1 to 3, using a silicon wafer (Si(100)) as the base material. Specifically, the target $TiO_2$ layer (thickness, 8 nm) was formed, and the mixed gas of argon gas and oxygen gas was ionized and bombarded by ion-assisted vapor deposition performed with the introduced oxygen gas. Note that the sheet resistance of the conductive layer itself cannot be measured because of the low resistivity of the silicon wafer (Si(100)). Thus, the conduction processing layer 33 was deposited on a glass substrate using the same procedure described above, and the electrical properties were confirmed.

FIG. 7 represents the deposition conditions of the conduction processing layer 33, the argon atom concentration (photoelectron escape angle=45°) obtained by XPS analysis, and the electrical characteristics. The results of XPS analysis at the photoelectron escape angle of 45° are believed to relatively reflect the state of the surface region 33a of the conduction processing layer 33. The XPS analysis thus revealed the presence of 2.0% or more argon atoms in the surface regions 33a of the conduction processing layers 33 of samples X1 to X3 of Examples 1 to 3.

Concerning the electrical characteristics of samples X1 to X3, the electrical resistance values themselves varied depending on such factors as differences in base material. However, the values of surface electrical resistance (initial sheet resistance), and the deterioration of electrical resistance (the durability of antistatic property) had the same tendency as those of samples R1 to R3. It was found from these results that the argon concentration in the surface region 33a of the conduction processing layer 33, typically the concentration of argon atoms determined by XPS analysis was preferably 2.0% or more, in order to obtain antistatic property. Further, considering the durability of antistatic performance (deterioration of electrical resistance), the preferred argon concentration in the surface region 33a of the conduction processing layer 33 was found to be 2.2% or more, further preferably 2.5% or more.

Figures 8A, 8B:
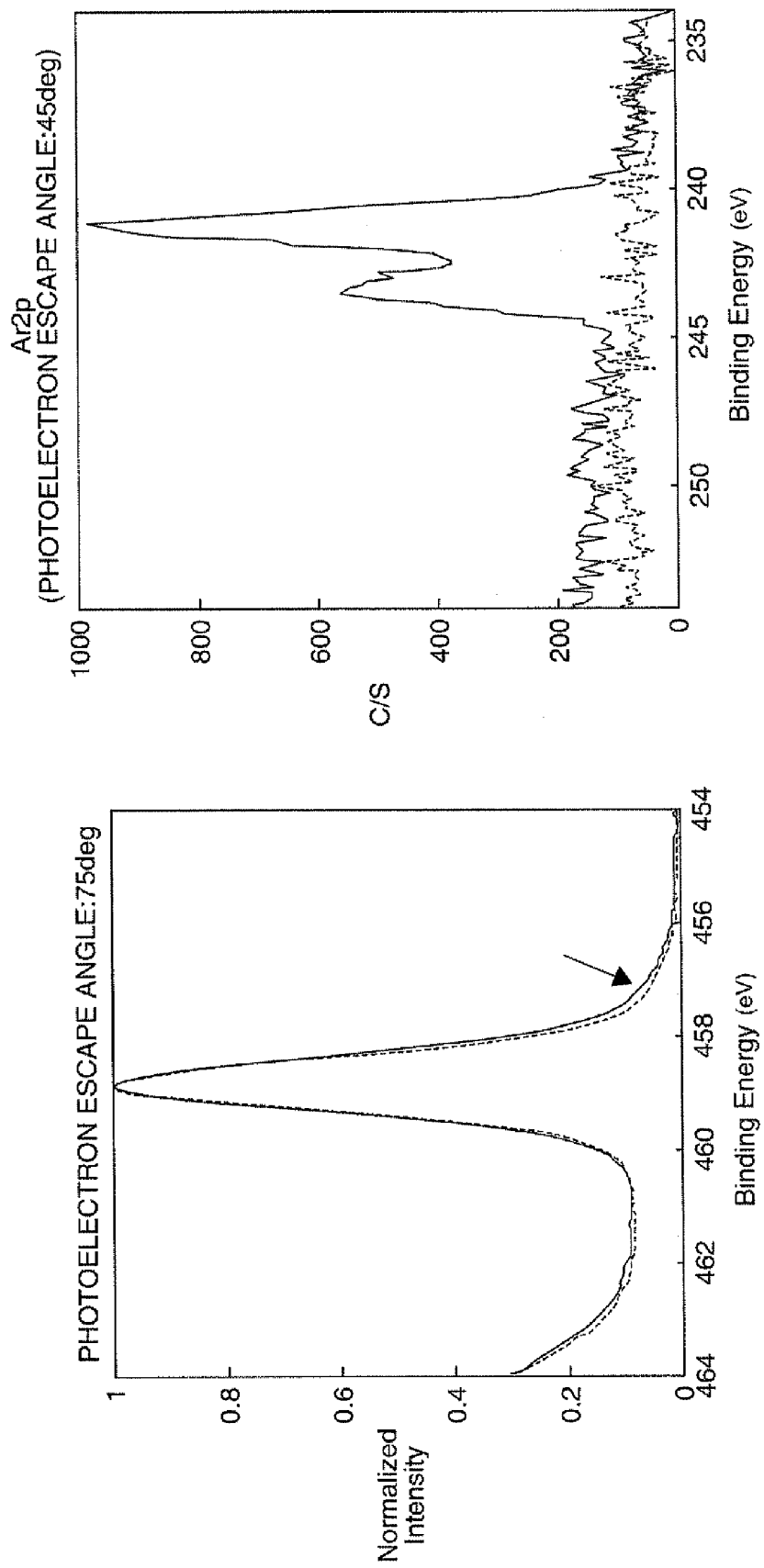

FIGS. 8A and 8B represent an example of spectra obtained by XPS analysis for sample X2. FIG. 8A represents an Ar2p spectrum (photoelectron escape angle=45°). The horizontal axis represents binding energy (bonding energy; eV), and the vertical axis represents photoelectron counts per second (c/s). For reference, the spectrum of a sample analyzed by XPS with a laminated target $TiO_2$ is indicated by broken line. By comparing the result with the result of XPS analysis for the reference sample, it can be seen that sample X2 contains argon in the surface region 33a.

FIG. 8B represents a photoelectron (Ti2p) spectrum from titanium atoms (photoelectron escape angle=75°). The horizontal axis represents binding energy (bonding energy; eV), and the vertical axis represents the normalized photoelectron intensity (normalized intensity). For reference, the spectrum of a sample analyzed by XPS with a laminated target $TiO_2$ is indicated by broken line. In the figure, the portion of the spectrum indicated by arrow represents the photoelectrons released from Ti in the low valency state, specifically in the $TiO_y$ (0<y<2, typically y=1.7) state (binding energy near 457 eV), in addition to the photoelectrons released from Ti in the $TiO_2$ state (bonding energy near 459 eV). Thus, it can be seen that, in sample X2, the ionization and bombardment of the mixed gas of argon gas and oxygen gas in the target $TiO_2$ layer forms the conduction processing layer 33 that includes argon gas in the surface region 33a, and the low-valency-state Ti, specifically $TiO_x$ (0<x≤2), at least in the surface region 33a.

5. Secondary Ion Mass Spectrometry (SIMS)

Figure 9:
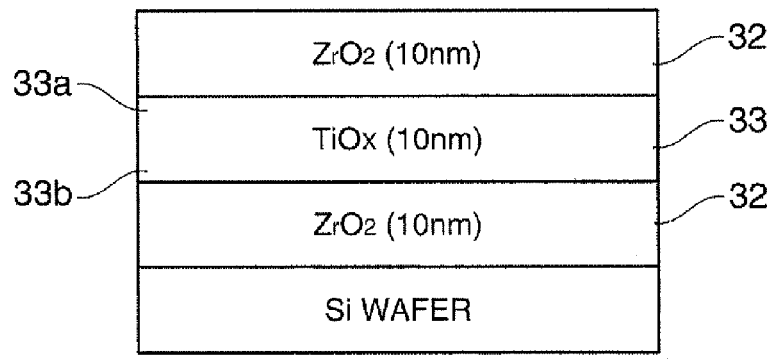
FIG. 9 is a diagram schematically illustrating a structure of a sample for SIMS analysis.

Sample SM2 for SIMS analysis, corresponding to sample S2 of Example 2, was produced to confirm the argon concentration in the surface region 33a of the conduction processing layer 33 by SIMS analysis. As illustrated in FIG. 9, sample SM2 for SIMS analysis was produced by forming a 10-nm thick $ZrO_2$ layer 32 under the deposition conditions (2.1.2.3) of the high-refractive-index layer of Example 2, using a silicon wafer (Si(100)) as the base material, and by forming a 10-nm thick $ZrO_2$ layer 32 after forming the conduction processing layer 33 under the deposition conditions (2.1.2.4) of the conduction processing layer 33. The target $TiO_2$ layer in the conduction processing layer 33 had a thickness of 10 nm.

Specifically, the target TiO$_2$ layer was formed in a thickness of 10 nm, and the mixed gas of argon gas and oxygen gas was ionized and bombarded to form the conduction processing layer 33.

In sample SM2 for SIMS analysis, the upper ZrO$_2$ layer 32 is formed to suppress contamination and oxidation on the surface of the conduction processing layer 33, and the elimination of Ar.

Figure 10:
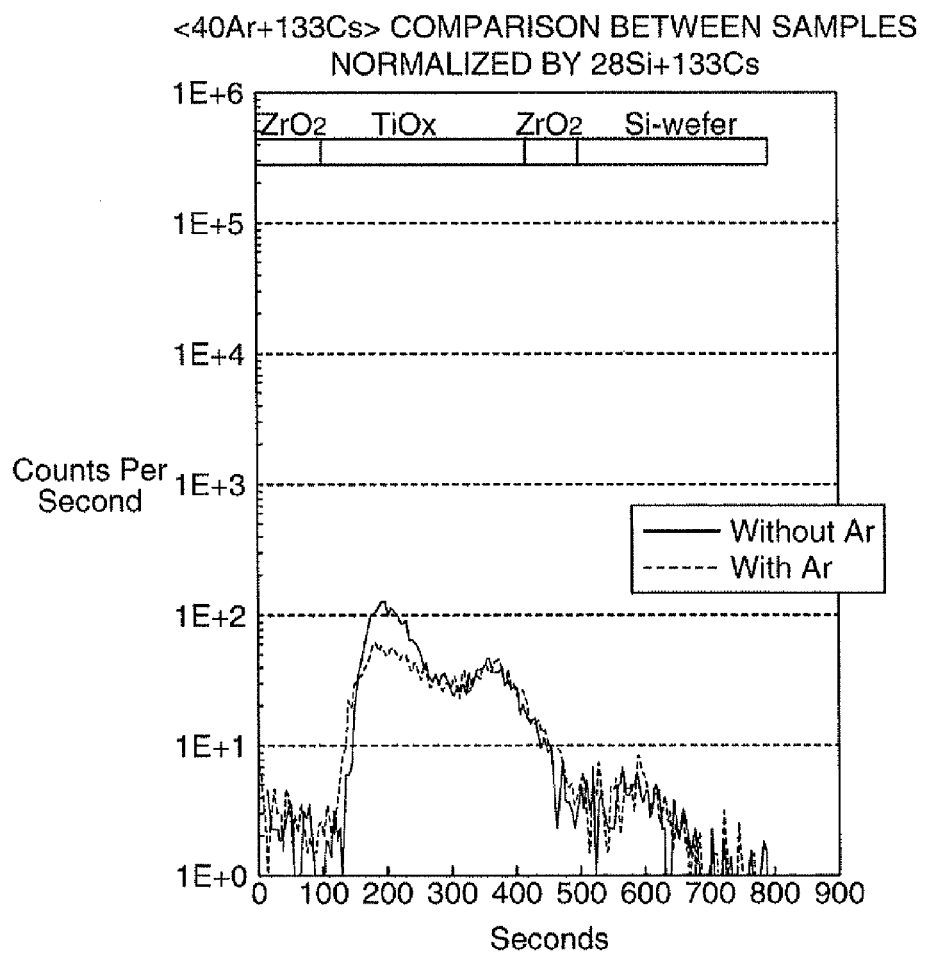
FIG. 10 is a diagram representing the depth profile measurement result of SIMS targeting Ar.

FIG. 10 represents the result of the depth profile measurement by SIMS analysis targeting Ar. In the SIMS analysis, the etching element cesium ions were bombarded on sample SM2 at 1.5 kV, 50 nA, and the etched component was analyzed, using PHI/Adept-1010. Along with the depth profile of sample SM2, FIG. 10 also represents the depth profile (broken line) of a comparative sample produced by forming a 10-nm thick TiO$_2$ layer and without bombarding the ionized mixed gas. The horizontal axis represents time (seconds), and the vertical axis represents target secondary ion ($^{40}$Ar+$^{113}$Cs)$^+$ ion (173 amu) counts per second (c/s).

The target secondary ions, ($^{40}$Ar+$^{113}$Cs)$^+$ ions (173 amu), are counted over the background of other ions such as ($^{94}$Zr+$^{46}$Ti+$^{17}$O+$^{16}$O)$^+$ ions (173 amu) (mass interference). As represented in FIG. 10, the depth profile of sample SM2 is believed to be the synthesis of the relatively sharp peak at a portion (near 150 seconds to 250 seconds) corresponding to the surface region 33a of the conduction processing layer 33, and a near trapezoidal peak at a portion (near 150 seconds to 400 seconds) corresponding to the whole of the conduction processing layer 33. On the other hand, the depth profile of the comparative sample only has a near trapezoidal peak at a portion (near 150 seconds to 400 seconds) corresponding to the whole of the TiO$_2$ layer. It is thus believed that the near trapezoidal peak at a portion (near 150 seconds to 400 seconds) corresponding to the whole of the conductive layer 33 and the TiO$_2$ layer is the background peak, and that the relatively sharp peak at a portion (near 150 seconds to 250 seconds) corresponding to the surface region 33a is the ($^{40}$Ar+$^{113}$Cs)$^+$ ion peak. It can be seen from this that the argon peak can be found by normalizing the SIMS depth profile by the second half of the near trapezoidal peak that appears at a portion corresponding to the deeper portion of the conductive layer 33 and the TiO$_2$ layer.

It was also found that the argon concentration in the conduction processing layer 33 was higher on the surface side (surface region) 33a than in the deeper portion (optical base material side) 33b. The gradient or steps in the argon concentration in the conduction processing layer 33 can be confirmed by the argon peak that appears on the surface side (surface region) 33a in the spectrum obtained by SIMS (secondary ion mass spectrometry) performed along the depth direction of the conduction processing layer 33 from the surface. Further, in the SIMS analysis, the spectrum representing the atomic weight of argon atoms in the conduction processing layer 33, specifically, the 173 amu depth profile, has a peak in the surface region 33a (the surface side) after being normalized by the spectrum in the deeper portion 33b (the optical base material side).

6. Measurement of Reflectance Changes

Figure 11:
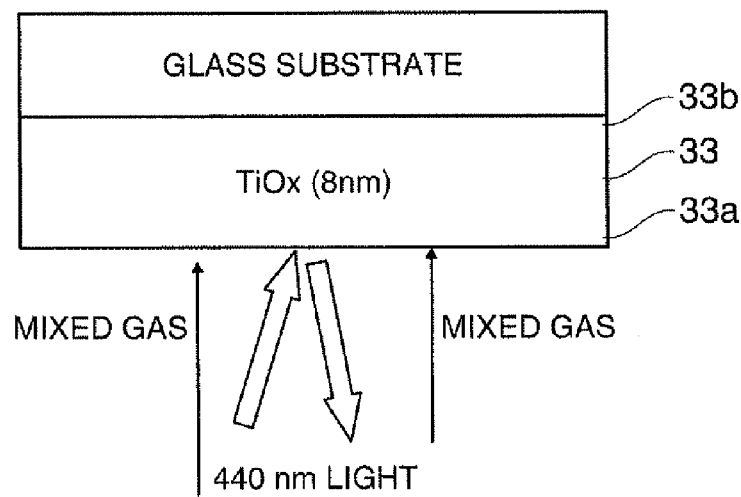
FIG. 11 is a diagram schematically representing a sample for reflectance measurement, and a reflectance measurement method.

Sample SL3, corresponding to sample S3 of Example 3, was produced for the measurement of reflectance changes, in order to confirm changes in the state of the conduction processing layer 33 during the ionization and bombardment of the mixed gas for layer formation. As illustrated in FIG. 11, sample SL3 was produced by forming the conduction processing layer 33 on a white glass (B270; Schott) substrate under the deposition conditions (2.1.2.4) of the conduction processing layer 33. Specifically, a target TiO$_2$ layer having a thickness of 8 nm was formed in sample SL3, and changes in reflectance during the formation of the conduction processing layer 33 undergoing the bombardment of the ionized mixed gas of argon gas and oxygen gas under the conditions of Example 3 were measured.

Figure 12:
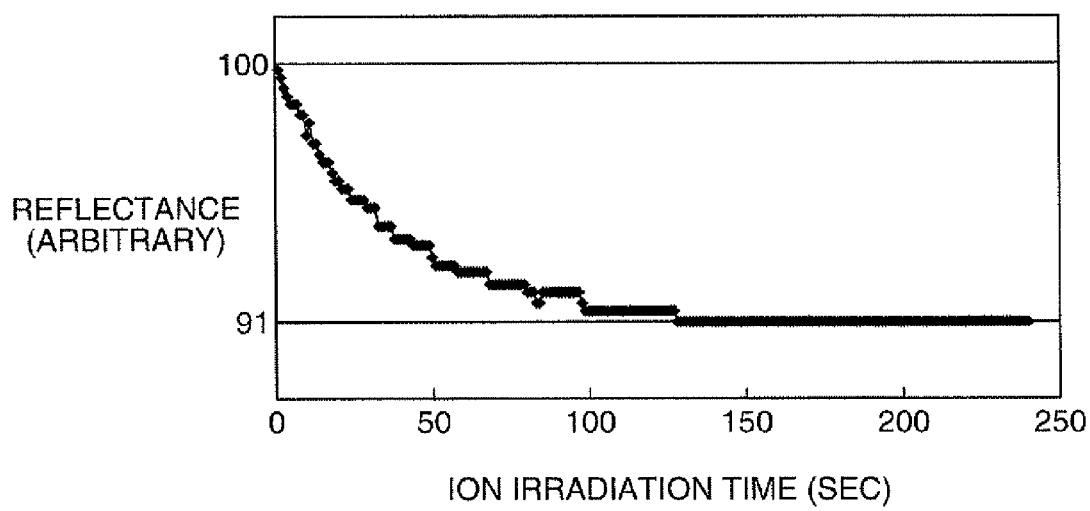
FIG. 12 is a diagram representing the result of reflectance measurement.

FIG. 12 represents the result of reflectance measurements. The reflectance measurements used an optical thickness meter (OPM-8; Shincron Co., Ltd.), and the reflectance of 440-nm wavelength light was measured. The light incident angle was set to 5° with respect to the normal line of the substrate. The reflectance is not a measure of the transmissivity of the conduction processing layer 33, but a measure by which the presence or absence of physical property changes is confirmed for the conduction processing layer 33 bombarded with the ionized gas. Accordingly, the measurement is intended to find relative changes in reflectance over time. FIG. 12 thus represents changes in reflectance relative to the reflectance 100 at the start of bombardment.

As represented in FIG. 12, the reflectance was shown to abruptly decrease for about 30 seconds from the start of the bombardment of the ionized mixed gas (Ar:O$_2$=16.5:3.5), and continuously lower gradually until about 100 seconds. It was also found that the reflectance substantially leveled off after about 100 seconds from the start of bombardment, and did not show almost any change after about 120 seconds. This result, combined with the results of Examples 1 to 3 (FIG. 4) and the result of XPS analysis (FIG. 7), suggests that the argon concentration in the surface region 33a shows a very abrupt increase following about 30 seconds of the irradiation of the mixed gas ion beam, before it substantially levels off after about 100 seconds of bombardment, and shows a very little increase after about 120 seconds.

It was thus found that the bombardment of the ionized mixed gas (ion beam irradiation time) for the formation of the conduction processing layer 33 was preferably 30 seconds or more, more preferably 100 seconds or more, further preferably 120 seconds or more. When bombarded for 300 seconds or longer, the sample (including the conduction processing layer 33) under the ion beam may rise to a temperature of several ten degrees, or to a temperature above the heat resistant temperature in the case of plastic base material. Because the argon concentration is believed to show a very little increase after 120 seconds of irradiation, the ion beam irradiation time is preferably 300 seconds or less.

7. Other Examples

7.1 Examples 4 to 9

Samples S4 to S9

Samples S4 to S9 of Examples 4 to 9 were produced in the same manner as for sample S1 of Example 1. In Examples 4 to 9, samples S4 to S9 were produced under the same conditions used in Example 1, except that the thickness of the target TiO$_2$ layer was varied in the deposition of the conduction processing layer (2.1.2.4), and that the bombardment of the ionized mixed gas was performed for 120 seconds (ion beam irradiation time) in all samples. The TiO$_2$ layer had a thickness of 4 nm for sample S4, 6 nm for sample S5, 8 nm for sample S6, 10 nm for sample S7, 12 nm for sample S8, and 15 nm for sample S9.

7.2 Evaluation of Samples S4 to S9

FIG. 13 summarizes the producing conditions and the evaluation results for samples S4 to S9 of Examples 4 to 9.

Samples S4 to S9 were measured for optical absorption loss and initial sheet resistance value, and evaluated for antistatic property (initial) and the durability of antistatic property. Note that the measurements and evaluation were performed in the same manner as for samples S1 to S3, and will not be described.

The optical absorption losses of samples S4 to S9 of Examples 4 to 9 were found to be 0.23%, 0.49%, 0.74%, 0.91%, 1.1%, and 1.4%, respectively, all confined within the range of around 1%. Samples S4 to S9 had sheet resistances of $5\times10^{10}$ [Ω/□], $1\times10^{9}$ [Ω/□], $3\times10^{8}$ [Ω/□], $2\times10^{8}$ [Ω/□], $1\times10^{8}$ [Ω/□], and $8\times10^{7}$ [Ω/□], below the value ($1\times10^{11}$ [Ω/□]) that represents a desirable antistatic property. Samples S4 to S9 all had excellent initial antistatic property, and desirable antistatic property durability. Samples with thicknesses of 6 nm and greater had particularly high antistatic property durability, and there was no decrease in antistatic property in samples with thicknesses of 8 nm and greater.

It was thus found that the thickness of the target $TiO_2$ layer bombarded with the ionized mixed gas for the formation of the conduction processing layer 33, specifically the thickness of the conduction processing layer 33 was preferably 4 nm or more, more preferably 5 nm or more, further preferably 6 nm or more, and most preferably 8 nm or more. Note that considering the adverse effects on absorption loss or on the optical characteristics of the multilayer antireflection coating, the thickness of the target $TiO_2$ layer, specifically the thickness of the conduction processing layer 33 is 15 nm or less, when the conduction processing layer 33 is formed independently from the high-refractive-index layer of other composition.

Samples S4 to S9 of Examples 4 to 9 were also evaluated for chemical resistance and swelling as in samples S1 to S3 of Examples 1 to 3. The evaluation results were desirable (Good) for both chemical resistance and swelling.

Second Embodiment

Figure 14:
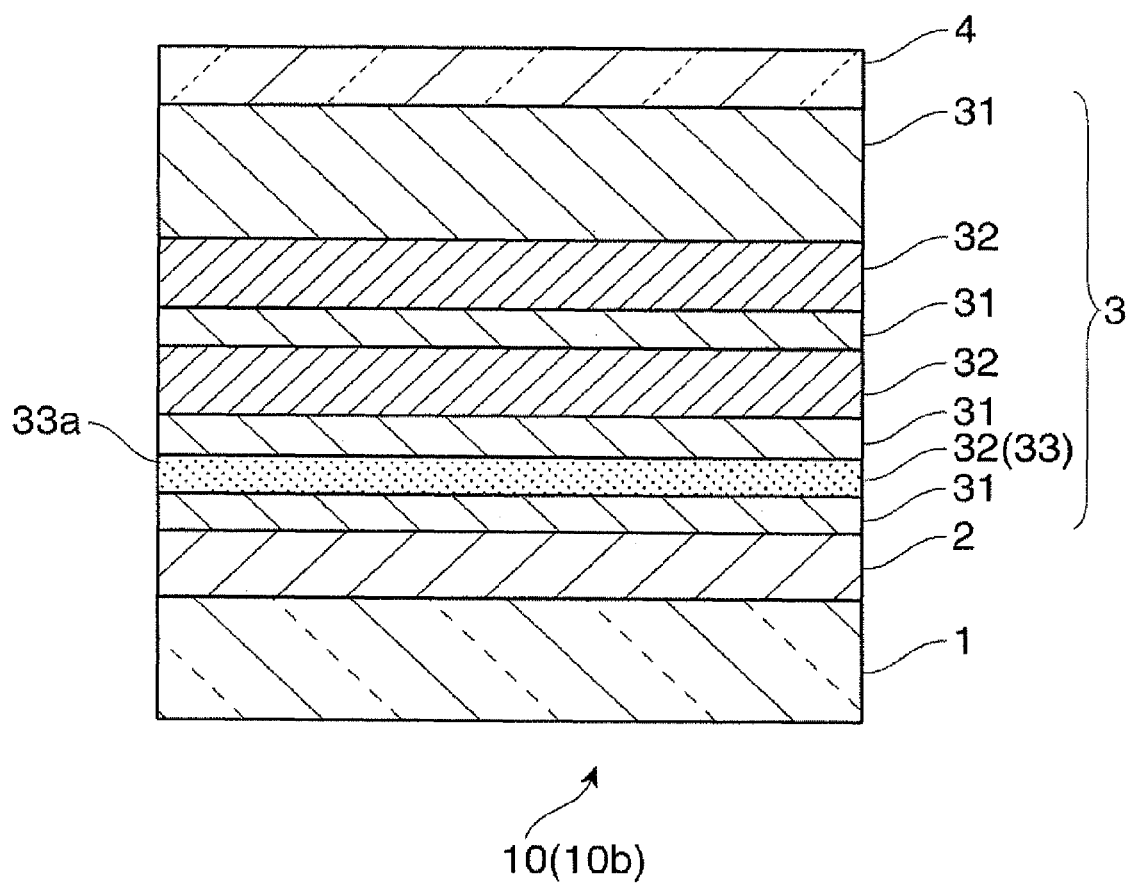
FIG. 14 is a cross sectional view illustrating a structure of a lens that includes a multilayer antireflection coating.

FIG. 14 represents an example of the invention applied to a different type of antireflection coating. A lens (optical article) 10b includes a lens base material (optical base material) 1, a hardcoat layer 2 formed on a surface of the lens base material 1, a multilayer antireflection coating 3 formed on the hardcoat layer 2, and an antifouling layer 4 formed on the antireflection coating 3.

FIGS. 15A, and 15B represent layer structures of the samples of Example 10 and Comparative Example 3 described below. The antireflection coating 3 has a 7-layer structure, in which four low-refractive-index layers 31 ($SiO_2$) and three high-refractive-index layers 32 ($TiO_2$) are alternately laminated. The lowermost high-refractive-index layer (second layer) 32 also serves as the first layer (conductive layer, conduction processing layer) 33, representing an example in which the conduction processing layer 33 is formed on the surface side of one of the high-refractive-index layers of the same composition.

8. Example 10 (Sample S10)

Example 11 (Sample S11)

In Examples 10 and 11, samples S10 and S11 were produced in the same manner as in Example 1, except for the deposition of the low-refractive-index layers and high-refractive-index layers (2.1.2.3), and the deposition of the conduction processing layer (2.1.2.4). In samples S10 and S11, the antireflection coating 3 includes $SiO_2$ low-refractive-index layers 31 representing the first, third, fifth, and seventh layers, which were deposited under the same deposition conditions (2.1.2.3) used for the low-refractive-index layer of Example 1, except that the thickness was set to have values presented in FIGS. 15A and 15B.

The second, fourth, and sixth layers in the antireflection coating 3 of sample S10 are high-refractive-index $TiO_2$ layers 32, which were deposited under the same conditions used for the target $TiO_2$ layer irradiated with the ion beam for the deposition of the conduction processing layer of Example 1 (2.1.2.4). Specifically, the $TiO_2$ layers were deposited by ion-assisted vapor deposition with the introduced oxygen gas. The deposition rate was 0.4 nm/sec, and the acceleration voltage and the current of the electron gun were 7 kV and 360 mA, respectively. Oxygen was used as the ion species for the ion assistance, which was performed at an ion assist voltage of 500 V under 150 mA current. The second, fourth, and sixth layers were controlled to have thicknesses of 13.3 nm, 46.0 nm, and 37.5 nm, respectively.

8.1 Formation of Conduction Processing Layer

The mixed gas of argon gas and oxygen gas was ionized and bombarded on the surface of the deposited second $TiO_2$ layer (lowermost high-refractive-index layer) during the formation of the antireflection coating 3 of sample S10. The same deposition conditions (2.1.2.4) used for the conduction processing layer of Example 1 were used except for the mixed gas ratio and the irradiation time. The mixed gas introduced to the ion gun contained 15 sccm of argon gas (Ar gas), and 5 sccm of oxygen gas ($O_2$ gas) in a 3:1 mixture ratio. The ion beam irradiation time was 120 seconds.

The mixed gas of argon gas and oxygen gas was ionized and bombarded on the surface of the deposited sixth $TiO_2$ layer (uppermost high-refractive-index layer) during the formation of the antireflection coating 3 of sample S11. The same deposition conditions (2.1.2.4) used for the deposition of the conduction processing layer of Example 1 were used except for the mixed gas ratio and the irradiation time. The mixed gas introduced to the ion gun contained 10 sccm of argon gas (Ar gas) and 10 sccm of oxygen gas ($O_2$ gas) in a 1:1 mixture ratio. The ion beam irradiation time was 120 seconds.

The proportions (mixture ratio) of the argon gas and oxygen gas in the mixed gas are preferably 10:1 to 1:2. A mixture ratio exceeding 10:1 promotes defect formation with the excess argon, and the low oxygen slows the defect recovery and thus tends to lower transparency. On the other hand, a mixture ratio below 1:2 makes it difficult to obtain antistatic performance because of the excessively low argon. The preferred mixture ratio is from 5:1 to 1:1. Note that the high-refractive-index $TiO_2$ layers 32 used for the conduction process are not limited to the lowermost layer (second layer) and the uppermost layer (sixth layer).

9. Comparative Example 3 (Sample R3)

Comparative Example 4 (Sample R4)

In Comparative Examples 3 and 4, samples R3 and R4 were prepared for comparison with sample S10. Samples R3 and R4 of Comparative Examples 3 and 4 were produced in the same manner as in Examples 10 and 11, and no conduction processing layer was formed (8.1).

10. Evaluation of Samples S10 and R3 and Samples S11 and R4

FIG. 16A summarizes the producing conditions and the evaluation results for samples S10 and R3. FIG. 16B summarizes the producing conditions and the evaluation results for samples S11 and R4. Samples S10 and S11 and samples R3 and R4 were measured for optical absorption loss and initial sheet resistance value, and evaluated for antistatic property (initial) and antistatic property durability. The measurements and evaluation were performed in the same manner as for samples S1 to S3.

Sample S10 of Example 10 had an optical absorption loss of 0.75%, and sufficiently high translucency. In terms of performance, differences from sample R3 of Comparative Example 3 were small. Sample S10 of Example 10 had a sheet resistance of $1\times10^9$ [Ω/□], a value smaller than the evaluation reference value $1\times10^{11}$ [Ω/□] for antistatic property. The evaluation result for antistatic property was thus desirable. (Good). Sample S10 also has antistatic property durability. On the other hand, sample R3 of Comparative Example 3 had a sheet resistance of $1\times10^{13}$ [Ω/□], and was evaluated as having a poor antistatic property.

Sample S11 of Example 11 had an optical absorption loss of 0.90%, and sufficiently high translucency. In terms of performance, differences from sample R4 of Comparative Example 4 were small. Sample S11 of Example 11 had a sheet resistance of $2\times10^9$ [Ω/□], a value smaller than the evaluation reference $1\times10^{11}$ [Ω/□] for antistatic property. The evaluation result for antistatic property was thus desirable (Good). Sample S11 also had antistatic property durability. On the other hand, sample R4 of Comparative Example 4 had a sheet resistance of $1\times10^{13}$ [Ω/□], and was evaluated as having a poor antistatic property.

Note that samples S10 and S11 of Examples 10 and 11 and samples R3 and R4 of Comparative Examples 3 and 4 were also evaluated for chemical resistance and swelling as for samples S1 to S3 of Examples 1 to 3. The evaluation results were desirable (Good) for both chemical resistance and swelling.

11. Closing Entry

It has been known that $TiO_z$ (0<z<2) has conductivity, and that this material develops conductivity as the oxygen losses (defects) serve as carriers. However, the conductivity decreases with decrease in defect concentration as recombinations take place. A stable $TiO_z$ film can be obtained by increasing the thickness or by reducing the z value but at the expense of transparency. It has thus been difficult to use the material for antistatic films (such as eyeglass lenses) that require transparency.

The invention, as described above, enables formation of the conductive, low-resistance layer (conduction processing layer, first layer) 33 having a reduced surface electrical resistance, by ionizing and bombarding a mixed gas of argon gas and oxygen gas on the target $TiO_2$ layer having a relatively thin thickness. SIMS analysis confirmed that the concentration of argon atoms in the conduction processing layer 33 was higher on the surface side (surface region) 33a than on the base material side (deeper portion) 33b. It is thus believed that the ionization and bombardment of the mixed gas of argon gas and oxygen gas on the surface of the $TiO_2$-containing target layer creates oxygen defects (oxygen losses) in the surface region 33a, and that the oxygen losses in the surface region 33a serve as carriers to develop conductivity. Further, the oxygen ions in the ionized mixed gas are believed to appropriately correct the argon ion-induced oxygen losses, and suppress a large decrease in light transmittance. It is also believed that the oxygen ions help create a state in which the argon atoms are captured in the surface region 33a. It is thus considered possible to form the conduction processing layer 33 in which the argon atoms can stably remain in the surface region 33a, and to thus maintain the antistatic property over extended time periods.

Specifically, in the surface region 33a of the conduction processing layer 33, the argon atoms are believed to be localized in the $TiO_2$ thin film with the adjacent tetravalent or lower titanium in the form of $TiO_z$ (0<z<2). Further, because of the stable presence of argon atoms, the $TiO_z$ is believed to also remain stable for stable conductivity. The conduction processing layer 33 sufficiently satisfies the transparency, conductivity, and durability required of eyeglass lenses.

Thus, with the conduction processing layer 33 formed in the antireflection coating 3, a lens can be provided that has effects and functions obtained by the development of conductivity, including the antistatic function, and the electromagnetic wave shielding function.

The low resistance process (conduction process) described herein is the process that has hardly any adverse effects on the optical functions of the conduction processing layer and of the functional layers including the conduction processing layer, and does not additionally require the optically detrimental lamination of thick conductive layers. For example, antistatic performance can be obtained without forming an ITO layer, which can cause deterioration of chemical resistance and moisture resistance, or without basically changing the design of the multilayer film forming the antireflection coating. Further, the surface resistance can be lowered without essentially changing the configuration, material, and vapor deposition process used for the antireflection coating of related art. The low resistance process is therefore readily applicable to a wide variety of optical articles at low cost.

The layer structures of the antireflection coating described in the foregoing Examples are merely examples, and the invention is not restricted by these layer structures. For example, the invention is also applicable to an antireflection coating of three or fewer layer structure, or to an antireflection coating of nine or more layer structure, and more than one layer can be subjected to the low resistance process. Further, the combination of the high-refractive-index layers and the low-refractive-index layers of the antireflection coating is not limited to $TiO_2/SiO_2$ and $ZrO_2/SiO_2$, and may be, for example, $Ta_2O_5/SiO_2$, $NdO_2/SiO_2$, $HfO_2/SiO_2$, or $Al_2O_3/SiO_2$. The surface layer of any of the layers in such combinations can be processed. Further, the invention is applicable to both inorganic antireflection coatings and organic antireflection coatings.

Figure 17:
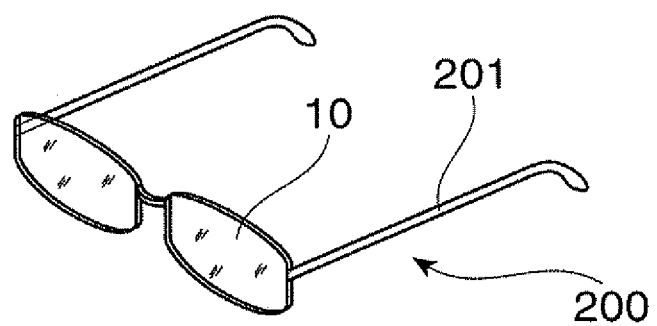
FIG. 17 is a diagram schematically illustrating eyeglasses.

Eyeglasses are an example of the article (product) or system using the optical article (lens) 10. FIG. 17 illustrates eyeglasses 200 that include an eyeglass lens 10 and a frame 201 attached to the eyeglass lens 10. The antistatic property of the eyeglass lens 10 has been improved by the ion bombardment.

Even though the foregoing described the eyeglass lens as an example of optical articles, the invention is not limited to eyeglass lenses. One other aspect of the invention is a system that includes the optical article, and an apparatus that projects and/or acquires images through the optical article. A typical example of the system that includes an apparatus for projection purposes is a projector. In this case, the optical article is typically, for example, a projection lens, a dichroic prism, or a cover glass. The technique described herein is also applicable to the light valve and other elements of LCDs (liquid crystal devices), an example of an image forming apparatus. The technique is also applicable to a system, such as a camera, used to acquire images through an optical article. In this case, the optical article is typically, for example, an imaging lens, or a cover glass. Further, the technique also can be used for imaging devices such as CCD. The technique is also applicable to an information recording apparatus such as DVD that accesses the information source through an optical article.

What is claimed is:

1. An optical article comprising:
   an optical base material; and
   a translucent layer that contains $TiO_x$ ($0<x\leq2$), the translucent layer is formed on the optical base material either directly or via some other layer, and the translucent layer has an argon concentration higher on a surface side of the translucent layer than on an optical base material side of the translucent layer,
   wherein the argon atom concentration on the surface side of the translucent layer is at least 2.0% as measured by XPS (X-ray photoelectron spectroscopy).

2. The optical article of claim 1, wherein an argon peak appears on the surface side in a spectrum obtained by secondary ion mass spectrometry performed for the translucent layer along a depth direction from the surface of the translucent layer.

3. The optical article of claim 2, wherein a spectrum corresponding to an atomic weight of argon atoms in the translucent layer after being normalized by a spectrum in the optical base material side of the translucent layer has a peak that appears on the surface side.

4. The optical article of claim 1, wherein the argon atom concentration is at least 2.5%.

5. The optical article of claim 1, wherein the translucent layer has a thickness of at least 4 nm.

6. The optical article of claim 5, wherein the translucent layer has a thickness of at least 8 nm.

7. The optical article of claim 1, wherein the optical article includes a multilayer antireflection coating, and wherein the translucent layer is included in the multilayer antireflection coating.

8. The optical article of claim 1, further comprising an antifouling layer formed on the translucent layer either directly or via some other layer.

9. The optical article of claim 1, wherein the optical base material is a plastic lens base material.

10. Eyeglasses comprising:
    an eyeglass lens comprising:
       an optical base material; and
       a translucent layer that contains $TiO_x$ ($0<x\leq2$), the translucent layer is formed on the optical base material either directly or via some other layer, and the translucent layer has an argon concentration higher on a surface side of the translucent layer than on an optical base material side of translucent layer, wherein the argon atom concentration on the surface side of the translucent layer is at least 2.0% as measured by XPS (X-ray photoelectron spectroscopy); and
    a frame attached to the eyeglass lens.

11. An optical article production method comprising:
    forming a $TiO_2$-containing translucent target layer on an optical base material either directly or via some other layer; and
    ionizing and bombarding a mixed gas of argon gas and oxygen gas on a surface of the target layer,
    wherein the step of ionizing and bombarding renders the argon concentration on the surface of the target layer higher than on an optical base material side of the target layer, and renders the argon atom concentration on the surface of the target layer at least 2.0% as measured by XPS (X-ray photoelectron spectroscopy).

12. The method of claim 11, wherein the target layer is one of layers included in a multilayer antireflection coating.

13. The method of claim 11, wherein the mixed gas is bombarded for 30 seconds to 300 seconds.

14. The method of claim 11, wherein a ratio of argon gas to oxygen gas contained in the mixed gas is 10:1 to 1:2.

* * * * *